US012652801B2

(12) United States Patent
  Choi et al.

(10) Patent No.: US 12,652,801 B2
(45) Date of Patent: Jun. 9, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Hyun-Mook Choi, Suwon-si (KR); Chae Lyoung Kim, Suwon-si (KR); Jihong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 18/219,755

(22) Filed: Jul. 10, 2023

(65) Prior Publication Data

US 2024/0215248 A1     Jun. 27, 2024

(30) Foreign Application Priority Data

Dec. 26, 2022   (KR) ........................ 10-2022-0184736

(51) Int. Cl.
  *H10B 43/35*       (2023.01)
  *H10B 43/27*       (2023.01)
(52) U.S. Cl.
  CPC ............. *H10B 43/35* (2023.02); *H10B 43/27* (2023.02)
(58) Field of Classification Search
  CPC ........................ H01L 21/28587–28593; H01L 23/49838–49844; H01L 2224/80894–80896; H10D 64/20–529; H10B 43/00–50; G11C 16/0466–0475; G11C 27/005; G11C 11/5671
  See application file for complete search history.

(56) References Cited

U.S. PATENT DOCUMENTS

| | | | |
|---|---|---|---|
| 10,651,198 B2 | 5/2020 | Baek et al. |
| 10,833,096 B2 | 11/2020 | Tanaka et al. |
| 10,985,178 B2 | 4/2021 | Kashima |
| 11,171,116 B2 | 11/2021 | Park |

(Continued)

FOREIGN PATENT DOCUMENTS

| | | |
|---|---|---|
| KR | 1020200132790 A | 11/2020 |
| KR | 1020220060620 A | 5/2022 |
| KR | 1020220117469 A | 8/2022 |

*Primary Examiner* — Matthew C Landau
*Assistant Examiner* — Nora T. Nix
(74) *Attorney, Agent, or Firm* — Muir Patent Law, PLLC

(57)     ABSTRACT

A semiconductor device includes gate layers and lower insulating layers that are alternately stacked on an upper surface of a substrate, a channel structure passing through the gate layers and the lower insulating layers and extending in a vertical direction, a string select gate layer disposed on the channel structure, a string select channel structure passing through the string select gate layer and extending in the vertical direction, and a contact pad disposed in a space between the channel structure and the string select channel structure and connecting the channel structure to the string select channel structure. A lower surface of the contact pad contacts the channel structure and an upper surface of the contact pad contacts the string select channel structure. A first width of the lower surface of the contact pad is greater than a second width of a central portion of the contact pad. A third width of the upper surface of the contact pad is greater than the second width of the central portion of the contact pad.

16 Claims, 33 Drawing Sheets

(56) References Cited

U.S. PATENT DOCUMENTS

| | | | |
|---|---|---|---|
| 11,744,070 B2 * | 8/2023 | Murakami | H10B 43/10 |
| | | | 257/314 |
| 2012/0188734 A1 * | 7/2012 | Mikado | H05K 1/185 |
| | | | 361/761 |
| 2017/0047342 A1 * | 2/2017 | Hwang | H10B 43/35 |
| 2019/0287994 A1 * | 9/2019 | Tanaka | H10B 43/10 |
| 2020/0185403 A1 | 6/2020 | Nyui et al. | |
| 2021/0143160 A1 | 5/2021 | Ryu et al. | |
| 2021/0202458 A1 * | 7/2021 | Jung | H01L 25/0657 |
| 2021/0399010 A1 | 12/2021 | Kim et al. | |

* cited by examiner

SEMICONDUCTOR DEVICE AND ELECTRONIC SYSTEM INCLUDING THE SAME

CROSS-REFERENCE TO RELATED APPLICATION

This application claims priority to and the benefit of Korean Patent Application No. 10-2022-0184736 filed in the Korean Intellectual Property Office on Dec. 26, 2022, the entire contents of which are herein incorporated by reference.

BACKGROUND

1. Field

The disclosure relates to a semiconductor device and an electronic system including the same.

2. Description of the Related Art

A semiconductor material conducts electricity under predetermined conditions. Various semiconductor devices including memory devices can be manufactured by using this semiconductor material. Such memory devices may be classified into volatile memory devices and non-volatile memory devices. The non-volatile memory devices may keep contents stored therein without loss even if power supplied thereto is cut off. The non-volatile memory devices may be used in various electronic devices such as mobile phones, digital cameras, and PCs.

Recently, a semiconductor device capable of storing high-capacity data is desirable in an electronic system requiring data storage. Accordingly, a method capable of increasing the data storage capacity of the semiconductor device is being researched. For example, as one of methods for increasing data storage capacity of a semiconductor device, a semiconductor device including three-dimensionally arranged memory cell transistors instead of two-dimensionally arranged memory cell transistors has been proposed.

SUMMARY

Embodiments are to provide a semiconductor device that may improve reliability and productivity and an electronic system including the same.

According to an embodiment, a semiconductor device includes a plurality of gate layers and a plurality of lower insulating layers that are alternately stacked on an upper surface of a substrate in a vertical direction that is perpendicular to the upper surface of the substrate, a channel structure passing through the plurality of gate layers and the plurality of lower insulating layers and extending in the vertical direction, a string select gate layer disposed on the channel structure, a string select channel structure passing through the string select gate layer and extending in the vertical direction, and a contact pad disposed in a space between the channel structure and the string select channel structure and connecting the channel structure to the string select channel structure. The string select channel structure, the contact pad, and the channel structure are arranged in the vertical direction. A lower surface of the contact pad contacts the channel structure and an upper surface of the contact pad contacts the string select channel structure. A first width of the lower surface of the contact pad is greater than a second width of a central portion of the contact pad.

A third width of the upper surface of the contact pad is greater than the second width of the central portion of the contact pad.

According to an embodiment, a semiconductor device includes a plurality of gate layers and a plurality of lower insulating layers that are alternately stacked on an upper surface of a substrate in a vertical direction that is perpendicular to the upper surface of the substrate, a plurality of channel structures passing through the plurality of gate layers and the plurality of lower insulating layers and extending in the vertical direction, a string select gate layer disposed on the plurality of channel structures, a plurality of string select channel structures passing through the string select gate layer and extending in the vertical direction, and a plurality of contact pads, wherein each of the plurality of contact pads is disposed in a space between a corresponding channel structure of the plurality of channel structures and a corresponding string select channel structure of the plurality of string select channel structures and connects the corresponding channel structure to the corresponding string select channel structure, Each of the contact pads includes a first portion with a first side surface of a positive slope, and a second portion disposed on the first portion and having a second side surface of a negative slope. The first side surface is connected to the second side surface. The plurality of contact pads include polysilicon.

According to an embodiment, an electronic system includes a main substrate, a semiconductor device on the main substrate, and a controller electrically connected to the semiconductor device on the main substrate. The semiconductor device includes a peripheral circuit area, a cell area including an input/output connection wire electrically connected to the peripheral circuit area, and an input/output pads electrically connected to the input/output connection wire extending into the cell area. The cell area includes a plurality of gate layers and a plurality of lower insulating layers that are alternately stacked on an upper surface of a substrate in a vertical direction that is perpendicular to the upper surface of the substrate, a channel structure passing through the plurality of gate layers and the plurality of lower insulating layers and extending in the vertical direction, a string select gate layer disposed on the channel structure, a string select channel structure passing through the string select gate layer and extending in the vertical direction, and a contact pad disposed in a space between the channel structure and the string select channel structure and connecting the channel structure to the string select channel structure. The string select channel structure, the contact pad, and the channel structure are arranged in the vertical direction. A lower surface of the contact pad contacts the channel structure and an upper surface of the contact pad contacts the string select channel structure. A first width of the lower surface of the contact pad is greater than a second width of a central portion of the contact pad. A third width of the upper surface of the contact pad is greater than the second width of the central portion of the contact pad.

According to the embodiments, it is possible to provide a semiconductor device with improved electrical connection characteristics by securing a contact area between a channel structure and a string select channel structure by a contact pad connecting the channel structure and the string select channel structure.

BRIEF DESCRIPTION OF THE DRAWINGS

FIG. 15 to FIG. 22 illustrate cross-sectional views for explaining a manufacturing method of a semiconductor device according to an embodiment.

DETAILED DESCRIPTION

Figure 1:
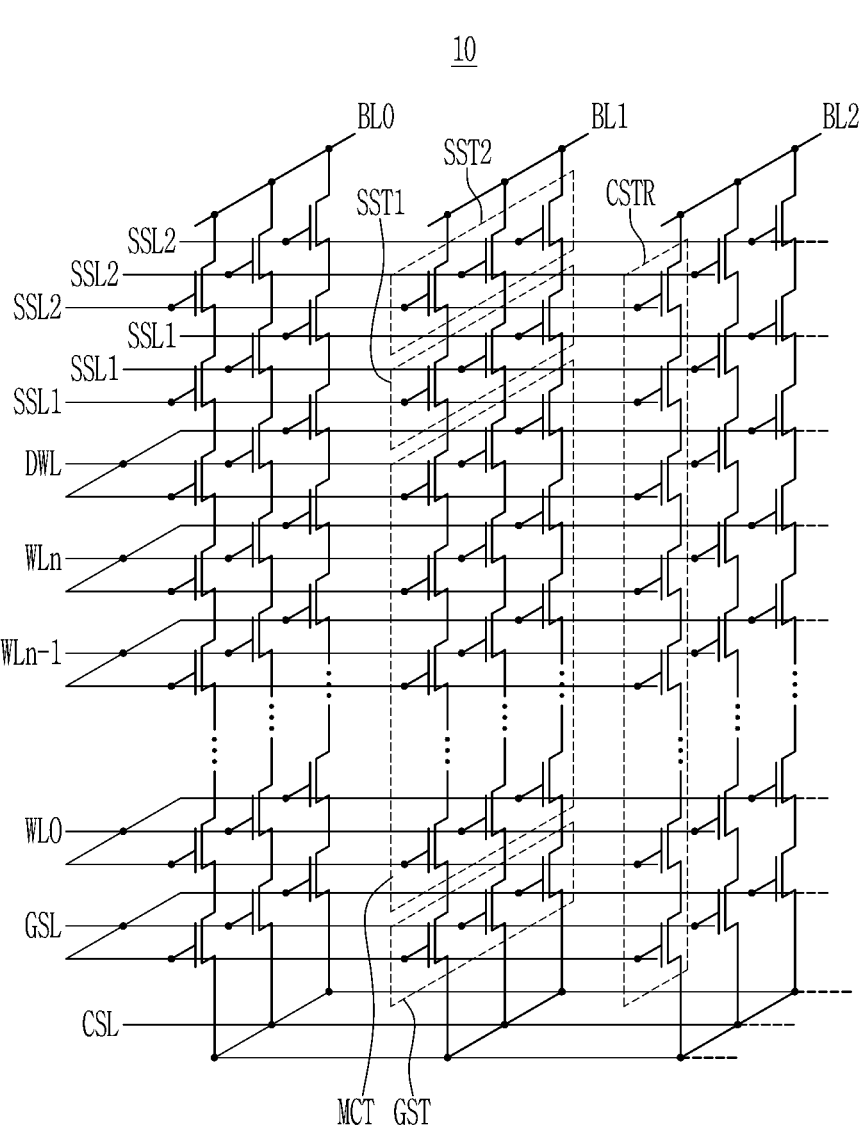
FIG. 1 illustrates an equivalent circuit diagram of a cell array of a semiconductor device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

In order to clearly describe the disclosure, parts or portions that are irrelevant to the description are omitted, and identical or similar constituent elements throughout the specification are denoted by the same reference numerals.

Further, in the drawings, the size and thickness of each element are arbitrarily illustrated for ease of description, and the disclosure is not necessarily limited to those illustrated in the drawings. In the drawings, the thicknesses of layers, films, panels, regions, or areas, are exaggerated for clarity. In the drawings, for ease of description, the thicknesses of some layers and areas are exaggerated.

It will be understood that when an element such as a layer, film, region, area, and substrate is referred to as being "on" another element, it can be directly on the other element or intervening elements may also be. In contrast, when an element is referred to as being "directly on" another element, there are no intervening elements. Further, in the specification, the word "on" or "above" means disposed on or below the object portion, and does not necessarily mean disposed on the upper side of the object portion based on a gravitational direction.

Unless explicitly described to the contrary, the word "comprise" and variations such as "comprises" and "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

FIG. 1 illustrates an equivalent circuit diagram of a cell array of a semiconductor device according to an embodiment.

Referring to FIG. 1, a memory cell array 10 includes a plurality of memory cell strings CSTR, and the plurality of memory cell strings CSTR may include memory cell transistors MCT connected in series with each other, and a ground select transistor GST and string select transistors SST1 and SST2 connected in series to opposite ends of the memory cell transistors MCT. The plurality of memory cell strings CSTR may be connected in parallel to each of bit lines BL0, BL1, and BL2. The plurality of memory cell strings CSTR may be commonly connected to a common source line CSL. That is, the plurality of memory cell strings CSTR may be disposed between the plurality of bit lines BL0, BL1, and BL2 and one common source line CSL. In some embodiments, a plurality of common source lines CSL may be two-dimensionally arranged.

The memory cell transistors MCT connected in series with each other may be controlled by word lines WL0, WLn−1, and WLn for selecting the memory cell transistors MCT. Each of the memory cell transistors MCT may include a data storage element. Gate layers of the memory cell transistors MCT disposed at substantially equivalent distances from the common source line CSL may be commonly connected to one of the word lines WL0, WLn−1, and WLn to be in an equipotential state. Alternatively, even if the gate layers of the memory cell transistors MCT are disposed at substantially equivalent distances from the common source lines CSL, the gate layers disposed in different rows or columns may be independently controlled. The ground select transistor GST may be controlled by a ground select line GSL, and may be connected to the common source line CSL. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The string select transistors SST1 and SST2 may be controlled by string select lines SSL1 and SSL2, and may be connected to the bit lines BL0, BL1, and BL2. FIG. 1 illustrates the structure in which one ground select transistor GST and two string select transistors SST1 and SST2 are respectively connected to the plurality of memory cell transistors MCT connected in series with each other, but in some embodiments, one string select transistor SST1 or SST2 may be connected thereto, or a plurality of ground select transistors GST may be connected thereto. One or more dummy lines DWL or buffer lines may be further disposed between the uppermost word line WLn of the word lines WL0, WLn−1, and WLn and the string select lines SSL1 and SSL2.

In some embodiments, one or more dummy lines DWL may be disposed between the lowermost word line WL0 and the ground select line GSL.

When a signal is applied to the string select transistors SST1 and SST2 through the string select lines SSL1 and SSL2, a signal applied through the bit lines BL0, BL1, and BL2 is applied to the memory cell transistors MCT connected in series with each other, so that data read and write operations may be executed.

An erase operation of erasing data written in the memory cell transistors MCT may be executed by applying a predetermined erase voltage through a substrate. In some embodiments, the memory cell array 10 may include at least one dummy memory cell string that is electrically isolated from the bit lines BL0, BL1, and BL2.

Hereinafter, a semiconductor device according to an embodiment will be described with reference to FIG. 2 to FIG. 5.

Figure 2:
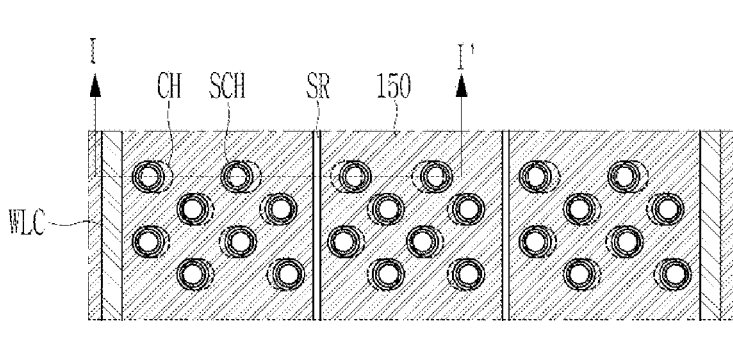
FIG. 2 illustrates a top plan view of a semiconductor device according to an embodiment.
Figure 2:
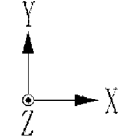
Figure 3:
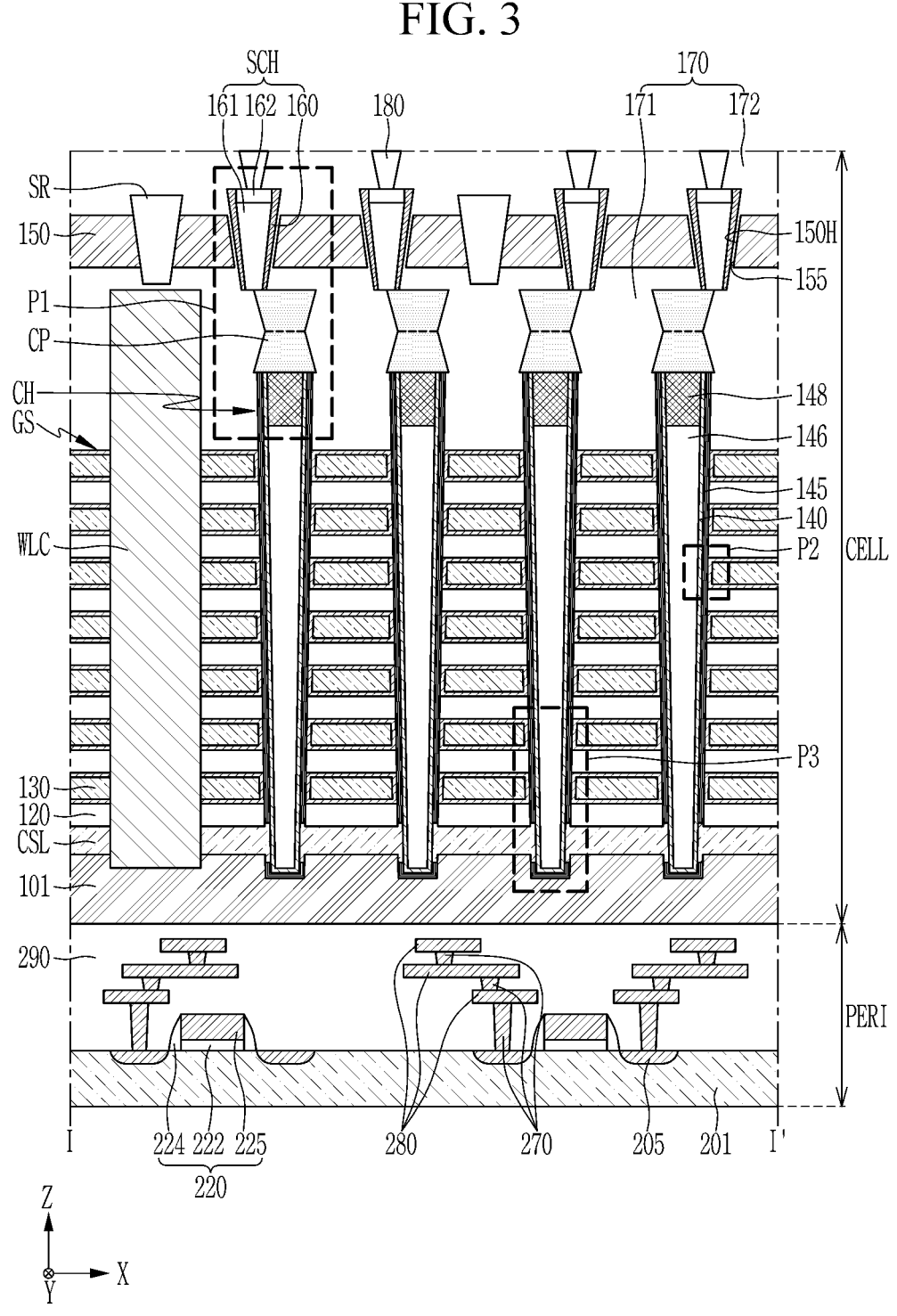
FIG. 3 illustrates a cross-sectional view taken along line I-I' of FIG. 2.
Figure 4:
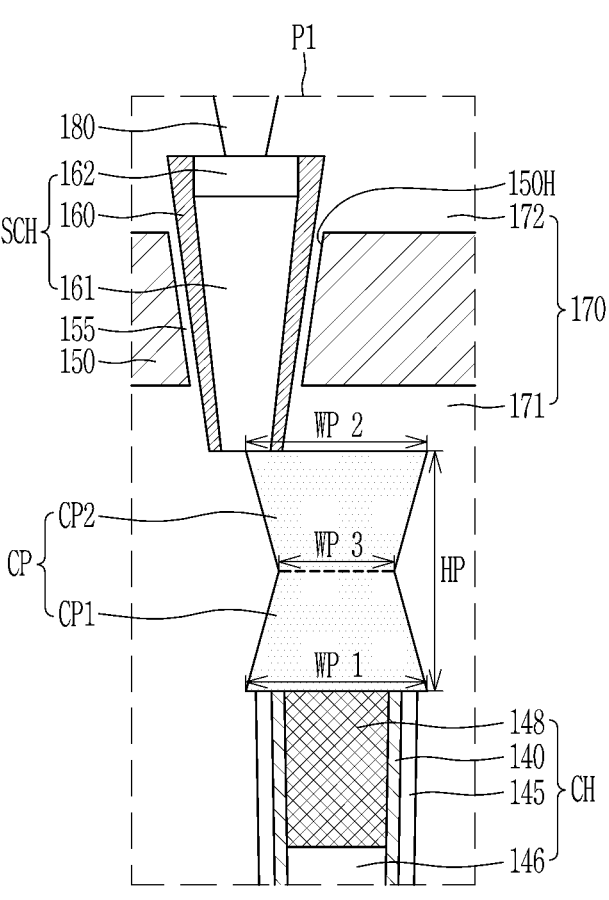
FIG. 4 illustrates a partial enlarged view of area "P1" of FIG. 3.
Figure 5:
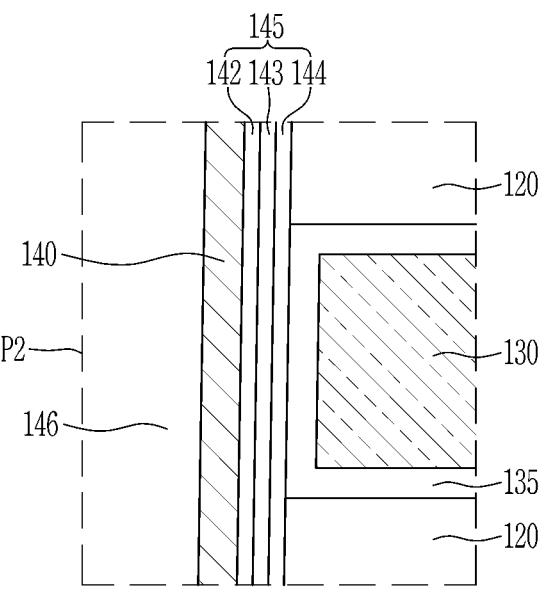
FIG. 5 illustrates a partial enlarged view of area "P2" of FIG. 3.
Figure 6:
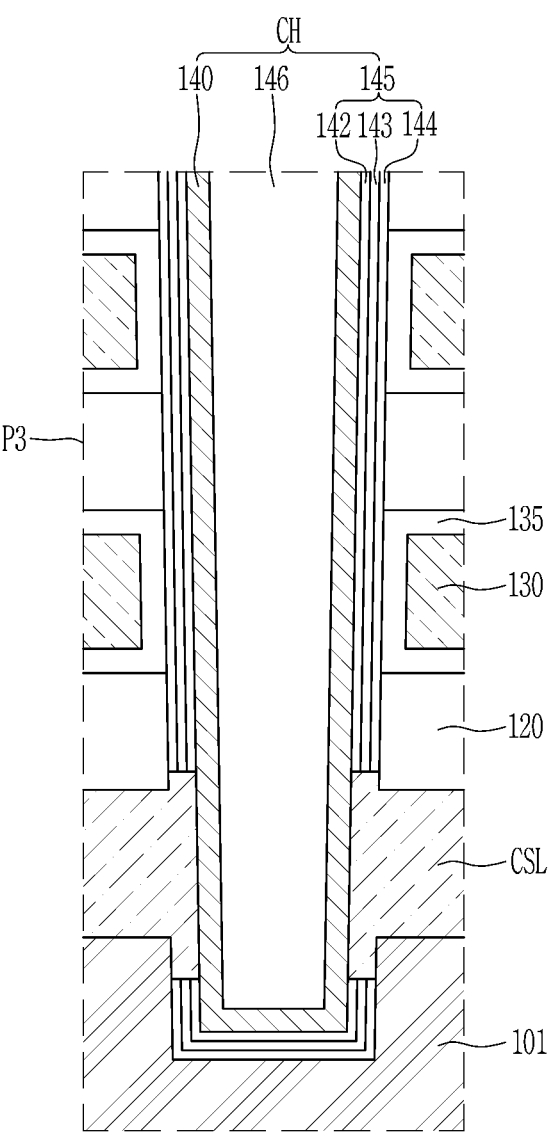
FIG. 6 illustrates a partial enlarged view of area "P3" of FIG. 3.

FIG. 2 illustrates a top plan view of a semiconductor device according to an embodiment. FIG. 3 illustrates a cross-sectional view taken along line I-I' of FIG. 2. FIG. 4 illustrates a partial enlarged view of area "P1" of FIG. 3. FIG. 5 illustrates a partial enlarged view of area "P2" of FIG. 3. FIG. 6 illustrates a partial enlarged view of area "P3" of FIG. 3.

Referring to FIG. 2 to FIG. 6, a semiconductor device 100 according to an embodiment may include a cell area (CELL) and a peripheral circuit area (PERI) that are vertically stacked. The cell area (CELL) and the peripheral circuit area (PERI) may be vertically stacked. The cell area (CELL) may be disposed on an upper portion of the peripheral circuit area (PERI). The present disclosure, however, is not limited thereto. In some embodiments, the cell area (CELL) may be disposed under a lower portion of the peripheral circuit area (PERI).

In an embodiment, in a semiconductor device 100, after the peripheral circuit area PERI is first formed, a substrate 101 of the cell area CELL may be formed thereon to form the cell area CELL.

The substrate 101 may have substantially the same size as a base substrate 201, or may be smaller than the base substrate 201. The cell area CELL and the peripheral circuit area PERI may be connected with each other. For the simplicity of drawings, such connections are not shown. For example, one ends of gate layers 130 in a second direction (Y direction) may be electrically connected to the circuit elements 220.

The peripheral circuit area PERI may include the base substrate 201, and circuit elements 220, circuit contact plugs 270, and circuit wire lines 280 that are disposed on the base substrate 201.

The base substrate 201 may have an upper surface extending in a first direction (X direction) and the second direction (Y direction). In the base substrate 201, a separate element isolating layer may be formed to define an active area. Source/drain areas 205 including impurities may be disposed in a portion of the active area. The base substrate 201 may include or may be formed of a semiconductor material, for example, a group IV semiconductor, a group III-V compound semiconductor, or a group II-VI compound semiconductor.

The circuit elements 220 may include horizontal transistors. Each of the circuit elements 220 may include a circuit gate dielectric layer 222, a spacer layer 224, and a circuit gate electrode 225. Source/drain areas 205 may be disposed within the base substrate 201 at opposite sides of the circuit gate electrode 225.

A peripheral area insulating layer 290 may be disposed on the circuit element 220 on the base substrate 201. The circuit contact plugs 270 may pass through the peripheral area insulating layer 290 to be connected to the source/drain areas 205. An electrical signal may be applied to the circuit element 220 by the circuit contact plugs 270. The circuit contact plugs 270 may also be connected to the circuit gate electrode 225. For the simplicity of drawings, such connections are not shown. The circuit wire lines 280 may be connected to the circuit contact plugs 270, and may be disposed as a plurality of layers.

The cell area CELL may include the substrate 101, the common source line CSL disposed on the substrate 101, the gate layers 130, interlayer insulating layers 120, and the gate layers 130. The gate layers 130 may be spaced apart from each other and may be substantially perpendicularly stacked on the common source line CSL. The interlayer insulating layers 120 may be alternately stacked with the gate layers 130.

The semiconductor device 100 may include channel structures CH that pass through the gate layers 130, the interlayer insulating layers 120, and the common source line CSL and extend into the substrate 101. Each of the channel structures CH may include a channel layer 140 that extends in a direction substantially perpendicular to an upper surface of the substrate 101. The semiconductor device 100 may further include a string select gate layer 150 disposed on the channel structures CH, and string select channel structures SCH that extend through the string select gate layer 150 in a direction substantially perpendicular to the upper surface of the substrate 101. Each of the string select channel structures SCH may include the string select channel layers 160. The semiconductor device 100 may further include contact pads CP that are disposed in spaces between the channel structures CH and the string select channel structures SCH and connect the channel structures CH and the string select channel structures SCH. Each contact pad of the contact pads CP may connect a corresponding channel structure of the channel structures CH to a corresponding string select channel structure of the string select channel structures SCH. The semiconductor device 100 may further include a word line cut WLC that extends through stacked structure GS of the interlayer insulating layers 120 and the gate layers 130 and the common source line CSL, and a string separation structure SR that passes through the string select gate layer 150. The string separation structure SR may extend in a direction substantially perpendicular to the upper surface of the substrate 101.

The semiconductor device 100 may further include a gate blocking layer 135 surrounding each of the gate layers 130, a string select gate insulating layer 155 surrounding a sidewall of each of the string select channel structures SCH, an upper insulating layer 170 disposed on an uppermost gate layer of the gate layers 130, and studs 180 disposed on the string select channel structures SCH.

In the semiconductor device 100, one memory cell string may be configured around each channel layer 140, and a plurality of memory cell strings may be arranged in columns and rows in the first direction (X direction) and the second direction (Y direction).

The substrate 101 may have an upper surface parallel to the first direction (X direction) and the second direction (Y direction), and may have a thickness parallel to a third direction (Z direction) that is perpendicular to the first direction (X direction) and second direction (Y direction).

The substrate 101 may include or may be formed of a semiconductor material, for example, a group IV semiconductor, a group III-V compound semiconductor, or a group II-VI compound semiconductor. For example, the group IV semiconductor may include or may be formed of silicon, germanium, or silicon-germanium. The substrate 101 may be provided as a bulk wafer, an epitaxial layer, a silicon on insulator (SOI) layer, or a semiconductor on insulator (SeOI) layer.

The common source line CSL may be disposed on the upper surface of the substrate 101. The common source line CSL may be directly connected to the channel layer 140 around the channel structures CH. The common source line CSL may include or may be formed of a semiconductor material, for example, a polycrystalline silicon. The stacked structure GS may be disposed on an upper surface of the common source line CSL, and may include a plurality of interlayer insulating layers 120 and a plurality of gate layers 130. In this case, the interlayer insulating layers 120 and the gate layers 130 may be alternately stacked. For example, the interlayer insulating layer 120 may be disposed on the substrate 101, the gate layer 130 may be disposed on the interlayer insulating layer 120, and the interlayer insulating layer 120 and the gate layer 130 may be sequentially and repeatedly stacked on the gate layer 130.

The plurality of gate layers 130 are stacked along the third direction (Z direction) that is perpendicular to the upper surface of the common source line CSL, and the plurality of gate layers 130 may be spaced apart from each other by the plurality of interlayer insulating layers 120 disposed between them. The plurality of gate layers 130 may be word lines (see 'WL0, WLn−1, and WLn' in FIG. 1) configuring memory cell transistors of the semiconductor device 100 according to the embodiment (see 'MCT' in FIG. 1).

The gate layers 130 may include a lowermost gate electrode configuring a gate of a ground select transistor, and memory gate layers configuring the plurality of memory cell transistors MCT. The number of the memory gate layers configuring the memory cell transistors MCT may be determined according to the capacity of the semiconductor device 100. In some embodiments, two or more lower gate layers at the bottom portions of the gate layers 130 configuring the ground select transistor may be formed, and may have substantially the same structure as or a different structure from the gate layers 130 configuring the memory cell transistors MCT. Some of the gate layers 130, for example, memory gate layers adjacent to the lower gate electrode may be dummy gate layers.

The gate layers 130 are vertically spaced apart from each other and stacked on the substrate 101, and may be separated from each other and disposed in the first direction (X direction) by the word line cuts WLC extending in the third direction (Z direction). The gate layers 130 between a pair of the word line cuts WLC may form one memory block, but a range of the memory block is not limited thereto.

The gate layers 130 may include or may be formed of a conductive material. For example, the gate layers 130 may include or may be formed of doped silicon, a metal (for example, tungsten, copper, or aluminum), a metal nitride (for example, a titanium nitride, a tantalum nitride, or the like), a metal silicide, or a combination thereof. In some embodiments, the gate layers 130 may further include a diffusion barrier at the outside, and for example, the diffusion barrier may include or may be formed of a tungsten nitride (WN), a tantalum nitride (TaN), a titanium nitride (TiN), or a combination thereof.

The interlayer insulating layers 120 may include or may be formed of an insulating material such as a silicon oxide and a silicon nitride. However, the materials of the interlayer insulating layer 120 and the gate layer 130 are not limited thereto, and may be variously changed.

Each of the channel structures CH may form one memory cell string. The channel structures CH may be spaced apart from each other while forming rows and columns on the substrate 101. The channel structures CH may be arranged in a lattice pattern, or may be arranged in a zigzag form in one direction. The channel structures CH may have a columnar shape, and may have an inclined side surface. Each of the channel structures CH may have a width that decreases closer to the substrate 101 according to an aspect ratio.

The channel structures CH may include a channel layer 140, a gate dielectric layer 145, a channel insulating layer 146, and a channel pad 148.

The channel layer 140 may be formed in an annular shape. The channel layer 140 may surround a sidewall of the channel insulating layer 146, but is not limited thereto, and may be variously changed. For example, in some embodiments, the channel insulating layer 146 may be omitted, and the channel layer 140 may have a column shape such as a cylinder and a prism.

The channel layer 140 may include or may be formed of a semiconductor material such as a polycrystalline silicon and a single crystal silicon, and the semiconductor material may be an undoped material or a material containing p-type or n-type type impurities.

The gate dielectric layer 145 may be disposed in a space between the gate blocking layer 135 and the channel layer 140. The gate blocking layer 135 may surround each of the gate layers 130. Referring to FIG. 5, the gate dielectric layer 145 may include a tunneling layer 142, a charge storage layer 143, and a blocking layer 144 that are sequentially arranged from the channel layer 140. Like the channel layer 140, the tunneling layer 142, the charge storage layer 143, and the blocking layer 144 may extend in a direction substantially perpendicular to the substrate 101.

Charges of the channel layer 140 may pass through the tunneling layer 142 to be stored in the charge storage layer 143 by using an F-N tunneling method. The tunneling layer 142 may include or may be formed of, for example, a silicon oxide ($SiO_2$), a silicon nitride ($Si_3N_4$), a silicon oxynitride (SiON), or a combination thereof.

The charge storage layer 143 may function as a charge trap layer, and may include or may be formed of a silicon nitride.

The blocking layer 144 may include or may be formed of a silicon oxide ($SiO_2$), a silicon nitride ($Si_3N_4$), a silicon oxynitride (SiON), a high-k material, or a combination thereof.

The high-k material refers to a dielectric material having a higher dielectric constant than a silicon oxide ($SiO_2$). The high-k material may include, for example, an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), a praseodymium oxide ($Pr_2O_3$), or a combination thereof.

In the channel structures CH, the channel layer 140, the gate dielectric layer 145, and the channel insulating layer 146 may pass through the common source line CSL and extend into the substrate 101. A portion of the gate dielectric layer 145 may be removed from lower ends of the channel structures CH, and the common source line CSL may be connected to the channel layer 140 in an area in which the gate dielectric layer 145 is removed. For example, the lower ends of the channel structure CH may be exposed from the gate dielectric layer 145. The channel layer 140 may contact the common source line CSL.

The channel pads 148 may be disposed on an upper portion of the channel layer 140 in the channel structures CH. The channel pads 148 may cover an upper surface of the channel insulating layer 146 and be electrically connected to the channel layer 140. The channel pads 148 may include or may be formed of, for example, doped polycrystalline silicon.

The string select gate layers 150 may be disposed on the channel structures CH. The string select gate layers 150 may extend in the second direction (Y direction), and may be separated from each other at regular intervals in the first direction (X direction) by a string separation structure SR.

The number of string select gate layers 150 separated by the string separation structure SR is not limited to that shown, and may be variously changed. The string select gate layers 150 may also be separated from each other in the first direction (X direction) by the string separation structure SR. The string select gate layers 150 are gate electrodes of string select transistors, and may correspond to the string select lines SSL1 and SSL2 as shown in FIG. 1.

In the embodiment, some of the string separation structures SR may overlap the word line cut WLC in the third direction (Z direction). In FIG. 3, a central axis of the word line cut WLC and a central axis of the string separation structure SR coincide with each other and overlap in the third direction (Z direction), but are not limited thereto. For example, in some embodiments, the central axis of the word line cut WLC and the central axis of the string separation structure SR may be staggered, and may overlap each other in the third direction (Z direction).

In some embodiments, the string separation structure SR may be in the form of a line or rectangular shape extending in the second direction (Y direction), but may be disposed in a zigzag form in one direction.

The string select gate layers 150 may include a plurality of string select gate holes 150H, and the disposition and/or number of the plurality of string select gate holes 150H are not limited to that shown in FIG. 3, and may be variously changed. The plurality of string select gate holes 150H may expose the channel structures CH, and may be formed to be offset from the channel structures CH in the third direction (Z direction). For example, when viewed in a plan view, each string select gate hole of the string select gate holes 150H may partially expose a corresponding channel structure of the channel structures CH. For example, when viewed in a plan view, a center of each string select gate hole may be spaced apart from a center of the corresponding channel structure in the first direction (X direction).

The string select channel structures SCH may be disposed through the plurality of string select gate holes 150H of the string select gate layers 150, and may be connected to the channel structures CH by contact pads CP that will be described later. The plurality of string select gate holes 150H may have a greater width than that of the string select channel structures SCH within the plurality of string select gate holes 150H.

The string select gate layers 150 may include or may be formed of a semiconductor material such as a polycrystalline silicon and a single crystal silicon, and the semiconductor material may be an undoped material or a material including p-type or n-type impurities.

The string select gate insulating layer 155 may surround each of the string select channel layers 160 that is disposed in a corresponding one of the plurality of string select gate holes 150H. The string select gate insulating layer 155 may serve as a gate dielectric layer of string select transistors. For example, the string select gate insulating layer 155 may be a layer that insulates the string select gate layer 150 from the string select channel layer 160.

The string select gate insulating layer 155 may be connected to the upper insulating layer 170. The upper insulating layer 170 may include a first upper insulating layer 171 disposed below the string select gate layer 150 and a second upper insulating layer 172 disposed above the string select gate layer 150. In an embodiment, the first upper insulating layer 171 and the second upper insulating layer 172 may include the same material. The string select gate insulating layer 155 may be integrally formed with the upper insulating layer 170.

The string select channel structures SCH may be spaced apart from each other while forming rows and columns on the substrate 101, and may be staggered with the channel structures CH. For example, when viewed in a plan view, each of the string select channel structures SCH may partially overlap a corresponding one of the channel structures CH in the X direction. The string select channel structures SCH may be arranged in a lattice pattern, or may be arranged in a zigzag form in one direction. The string select channel structures SCH may pass through the string select gate layers 150 and extend perpendicularly to the substrate 101.

The string select channel structures SCH may have a columnar shape, and may have an inclined side surface. A width of each of the string select channel structures SCH may decrease closer to the substrate 101 according to an aspect ratio. Each of the string select channel structures SCH may include the string select channel layers 160 extending perpendicularly to the substrate 101, a string select insulating layer 161 inside the string select channel layers 160, and a string select channel pad 162. Side surfaces of the string select channel pad 162 may be surrounded by the string select channel layers 160. A lower surface of the string select channel pad 162 may be covered by the string select insulating layer 161. An upper surface of the string select channel pad 162 may be coplanar with upper ends of the string select channel layers 160 and may be exposed at a space between the string select channel layers 160.

The string select channel layers 160 may be formed in an annular shape surrounding the inner string select insulating layer 161. In an embodiment, the string select channel layers 160 may be connected with each other to form the annular shape that surrounds a side surface of the string select channel pad 162 and a side surface of the string select insulating layer 161. The present disclosure, however, is not limited thereto. In some embodiments, the string select insulating layer 161 may be omitted, and the string select channel layers 160 that are connected with each other may have a column shape such as a cylinder and a prism.

The string select channel layers 160 may include or may be formed of a semiconductor material such as a polycrystalline silicon and a single crystal silicon, and the semiconductor material may be an undoped material or a material including p-type or n-type impurities. The string select channel layers 160 may include the same material as the channel layer 140.

The string select insulating layer 161 may be disposed inside the string select channel layers 160, and may have an inclined side surface. A width of the string select insulating layer 164 may decrease as it approaches the substrate 101 according to an aspect ratio. The present disclosure, however, is not limited thereto. In some embodiments, the string select insulating layer 161 may have a side surface extending in the third direction that is perpendicular to an upper surface of the substrate 101.

The string select insulating layer 161 may include or may be formed of an insulating material such as a silicon oxide and a silicon nitride. The present disclosure, however, is not limited thereto. In some embodiments, the insulating material of the string select insulating layer 161 may be variously changed.

The string select channel pads 162 may be disposed on the upper portion of the string select channel layer 160 within the string select channel structures SCH. The string select channel pads 162 may cover an upper surface of the string select insulating layer 161 and be electrically connected to the string select channel layer 160.

The string select channel pad 162 may include or may be formed of a conductive material, for example, doped polycrystalline silicon.

The contact pads CP may be disposed in spaces between the channel structures CH and the string select channel structures SCH. Upper surfaces of the contact pads CP contact the string select channel structure SCH, and lower surfaces of the contact pads CP contact the channel structures CH, and accordingly, the contact pads CP may electrically connect the channel structures CH to the string select channel structures SCH.

Central axes of the contact pads CP coincide with central axes of the channel structures CH, and may be staggered with central axes of the string select channel structures SCH. The lower surfaces of the contact pads CP may entirely cover the upper surfaces of the channel structures CH. The lower surfaces of the contact pads CP may contact the channel structures CH. The upper surfaces of the contact pads CP may partially cover the lower surfaces of the string select channel structures SCH. The upper surfaces of the contact pads CP may contact the lower surfaces of the string select channel structures SCH. The term "contact," as used herein, refers to a direct connection (i.e., physical touching) unless the context indicates otherwise.

In the embodiment, a contact area of the lower surface of the contact pad CP contacting the channel structure CH may be larger than a contact area of the upper surface of the contact pad CP contacting the string select channel structure SCH.

The lower surfaces of the contact pads CP may be disposed above the channel structure CH, and may contact the upper surface of the channel layer 140, the upper surface of the gate dielectric layer 145, the upper surface of the channel insulating layer 146, and the upper surface of the channel pad 148.

The upper surfaces of the contact pads CP may contact the lower surfaces of the string select channel layer 160 and the lower surface of the string select insulating layer 161 disposed under the string select channel structure SCH.

As shown in FIG. 3, in the embodiment, the string select channel structures SCH disposed at one side of the first direction (X direction) based on the string separation structure SR may be staggered in one side of the first direction (X direction) based on the central axis of the contact pad CP, and the string select channel structures SCH disposed at the other side of the first direction (X direction) based on the string separation structure SR may be staggered in the other side of the first direction (X direction) based on the central axis of the contact pad CP.

The contact pads CP may not overlap the string separation structures SR in the third direction (Z direction). For example, when viewed in a plan view, the string separation structures SR may be disposed in spaces between the contact pads CP that are spaced apart from each other in the first direction (X direction).

Therefore, a distance between the string select channel structures SCH adjacent to each other in the first direction (X direction) may be different from a distance between the string select channel structures SCH spaced apart from each other in the first direction (X direction) with the string separation structure SR interposed therebetween.

Referring to FIG. 4, each of the contact pads CP may include a first portion CP1 contacting a corresponding one of the channel structures CH and a second portion CP2 disposed on the first portion CP1. The first portion CP1 and the second portion CP2 may have substantially the same area ratio and the same height. For example, the first portion CP1 and the second portion CP2 may be symmetrically disposed with respect to a boundary surface between the first portion CP1 and the second portion CP2.

A lower surface of the first portion CP1 contacts the channel structure CH, an upper surface of the first portion CP1 is connected to a lower surface of the second portion CP2, and a width of the first portion CP1 in the first direction (X direction) may decrease from the channel structure CH toward the string select channel structure SCH. Accordingly, opposite lateral surfaces of the first portion CP1 of the contact pads CP may have a positive taper slope (i.e., a positive slope).

The upper surface of the second portion CP2 contacts a corresponding string select channel structure of the string select channel structure SCH, and the width of the second portion CP2 in the first direction (X direction) may increase from the channel structure CH towards the string select channel structure SCH. Accordingly, opposite side surfaces of the second portion CP2 of the contact pad CP may have a reverse tapered slope (i.e., a negative slope).

The contact pads CP may have a substantial hourglass-like shape. However, the shape of each of the contact pads CP is not limited thereto, and as long as widths of the upper and lower surfaces of the contact pads CP are greater than a widths of the centers of the contact pads CP, the shape of each of the contact pads CP may be variously changed.

Although FIG. 3 illustrates that the contact pads CP disposed on the channel structure CH and spaced apart from each other along the first direction (X direction) have substantially the same shape, the disclosure is not limited thereto. For example, at least one of the plurality of contact pads CP may have a different shape. The contact pads CP having various other shapes will be described later with reference to FIG. 7 to FIG. 12.

The lower surface of the first portion CP1 may have a first width WP1 in the first direction (X direction), the upper surface of the second portion CP2 may have a second width WP2 in the first direction (X direction), and a boundary between the first portion CP1 and the second portion CP2 may have a third width WP3 in the first direction (X direction). In other words, the lower surface of the contact pad CP may have the first width WP1 in the first direction (X direction), the upper surface of the contact pad CP may have the second width WP2 in the first direction (X direction), and the central portion of the contact pad CP may have the third width WP3 in the first direction (X direction).

The first width WP1 and the second width WP2 may be substantially the same, and the first width WP1 and the second width WP2 may be greater than the third width WP3.

However, the disclosure is not limited thereto, and the first width WP1 and the second width WP2 may be different.

The first width WP1 and the second width WP2 may have a value of about 70 nm to about 140 nm, and the third width WP3 may have a value of about 7 nm to about 14 nm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

A height HP of the contact pad CP, that is, a length of the third direction (Z direction) from the lower surface to the upper surface of the contact pad CP, may have a value selected from a range of about 400 nm to about 500 nm. The present disclosure, however, is not limited thereto. In some embodiment, the height of the contact pad CP may be variously changed.

The contact pads CP may include or may be formed of doped polysilicon, metal, a conductive metal nitride, a conductive metal silicide, a conductive metal oxide, or a combination thereof. For example, the contact pads CP may include or may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but are not limited thereto.

The upper insulating layer 170 disposed on the gate layers 130 may include the first upper insulating layer 171 and the second upper insulating layer 172.

The first upper insulating layer 171 may be disposed between an uppermost gate layer of the gate layers 130 and the string select gate layers 150, and the second upper insulating layer 172 may be disposed on the string select gate layers 150.

A thickness of the first upper insulating layer 171 is thicker than that of the contact pads CP. The upper surface of the first upper insulating layer 171 may be disposed higher than the upper surfaces of the contact pads CP. That is, the distance from the substrate 101 to the upper surface of the first upper insulating layer 171 may be greater than the distance from the substrate 101 to the upper surface of the contact pads CP. Accordingly, the first upper insulating layer 171 may contact the upper surfaces and side surfaces of the contact pads CP, and may surround the upper surfaces and side surfaces of the contact pads CP.

The first upper insulating layer 171 may contact the side surfaces of the channel structures CH, and the side surfaces and the lower surfaces of the string select channel structures SCH.

The second upper insulating layer 172 may be disposed on the string select gate layers 150. Accordingly, the second upper insulating layer 172 may contact the upper surface of the string select channel structure SCH and the side surface disposed at the upper portion of the string select channel structure SCH. The second upper insulating layer 172 may contact a side surface of a stud 180 that will be described later.

The first upper insulating layer 171 and the second upper insulating layer 172 may include or may be formed of an insulating material such as a silicon oxide and a silicon nitride, and may include or may be formed of the same material as each other. However, they are not limited thereto, and the first upper insulating layer 171 and the second upper insulating layer 172 may include or may be formed of different materials.

The stud 180 may be disposed on the string select channel structures SCH, and penetrate the second upper insulating layer 172 to vertically extend to the upper surface of the substrate 101. The stud 180 may have an inclined side surface. A width of the stud 180 may decrease as it approaches the substrate 101 according to an aspect ratio. The present disclosure, however, is not limited thereto. In some embodiment, the shape of the stud 180 may be variously changed. For example, the stud 180 may have a side surface perpendicular to the substrate 101.

The stud 180 may contact the upper surface of the string select channel pad 162, and may be connected to the string select channel pad 162.

The stud 180 may include or may be formed of a metal nitride such as a titanium nitride (TiN) film, a tantalum nitride (TaN) film, and a tungsten nitride (WN) film, and/or metal such as aluminum (Al), tungsten (W), and molybdenum (Mo). However, the disclosure is not limited thereto.

In the semiconductor device 100, the lower surfaces of the contact pads CP may contact the channel structures CH, and the upper surface of the contact pads CP may contact the string select channel structure SCH. The widths of the lower surfaces of the contact pads CP and the widths of the upper surfaces of the contact pads CP may be greater than the widths of the central portions of the contact pads CP. When the central axes of the string select channel structures SCH are staggered with the central axes of the channel structures CH on the channel structures CH, it is possible to secure connection between the upper surfaces of the contact pads CP and the string select channel structures SCH. For example, the upper surfaces of the contact pads CP may more stably contact the string select channel structures SCH.

Therefore, as the upper surface of the contact pads CP contacting the string select channel structures SCH is widened, the contact pads CP may more stably contact the string select channel structures SCH, and the channel structures CH and the string select channel structures SCH may be more stably electrically connected by the contact pads CP. As a result, a semiconductor device having improved electrical connection characteristics may be provided.

Hereinafter, a semiconductor device according to an embodiment will be described with reference to FIG. 7 to FIG. 12. In the following embodiment, the same components as those in the previously described embodiment are denoted by the same reference numerals, and redundant descriptions thereof will be omitted or simplified, and differences will be mainly described.

Figure 7:
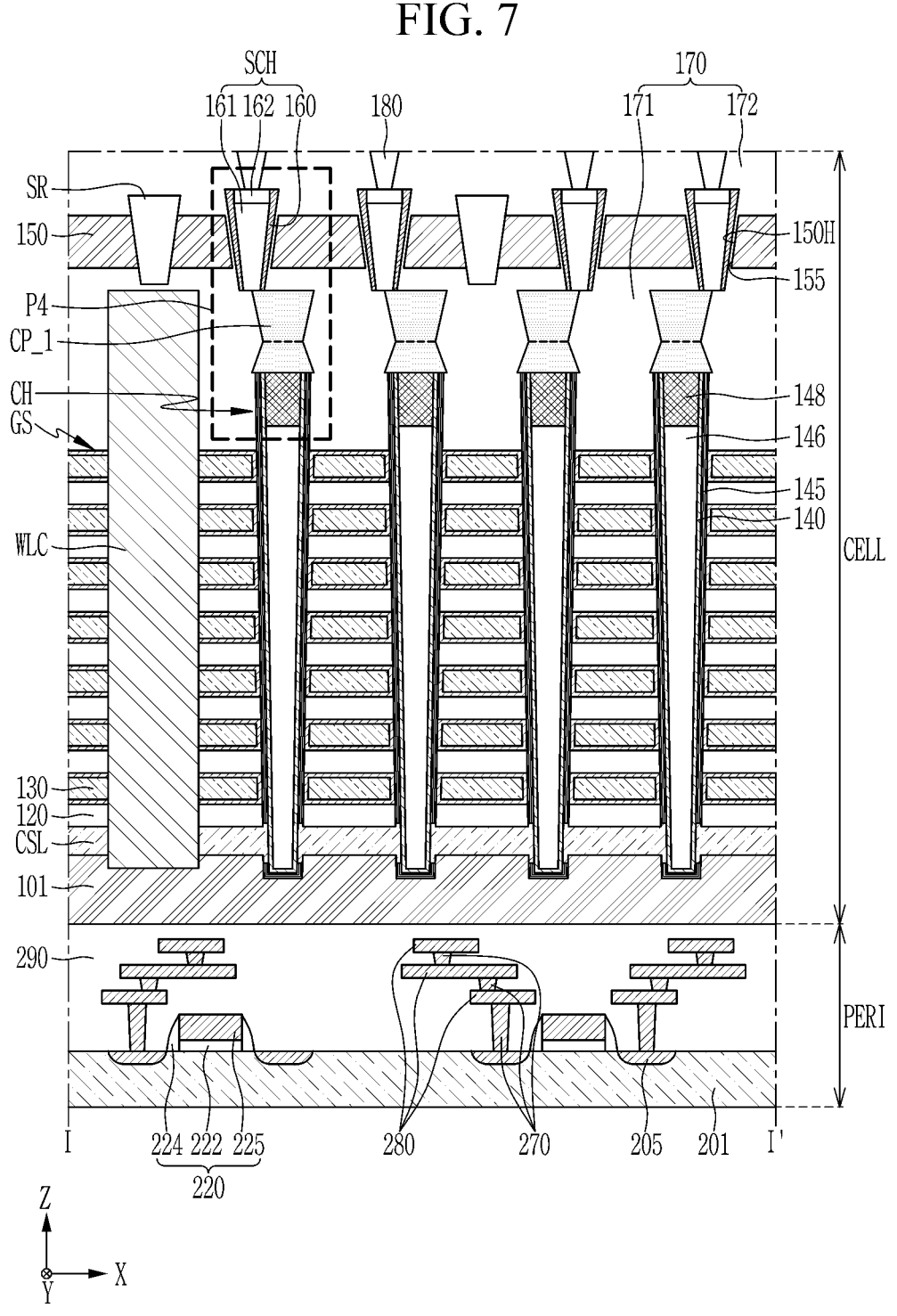
FIG. 7 illustrates a cross-sectional view taken along line I-I' of FIG. 2 according to an embodiment.
Figure 8:
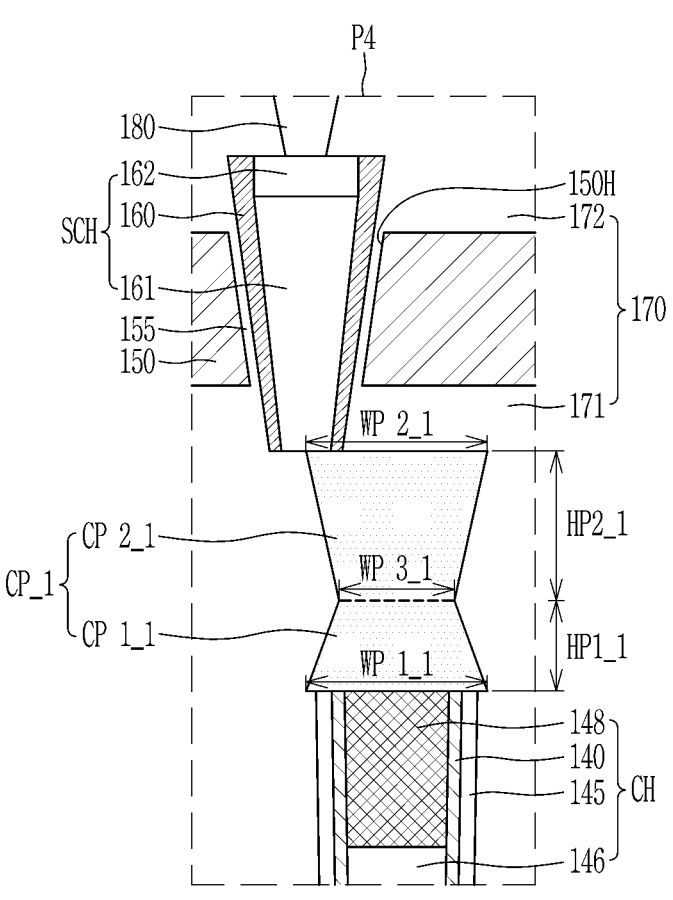
FIG. 8 illustrates a partial enlarged view of area "P4" of FIG. 7.
Figure 9:
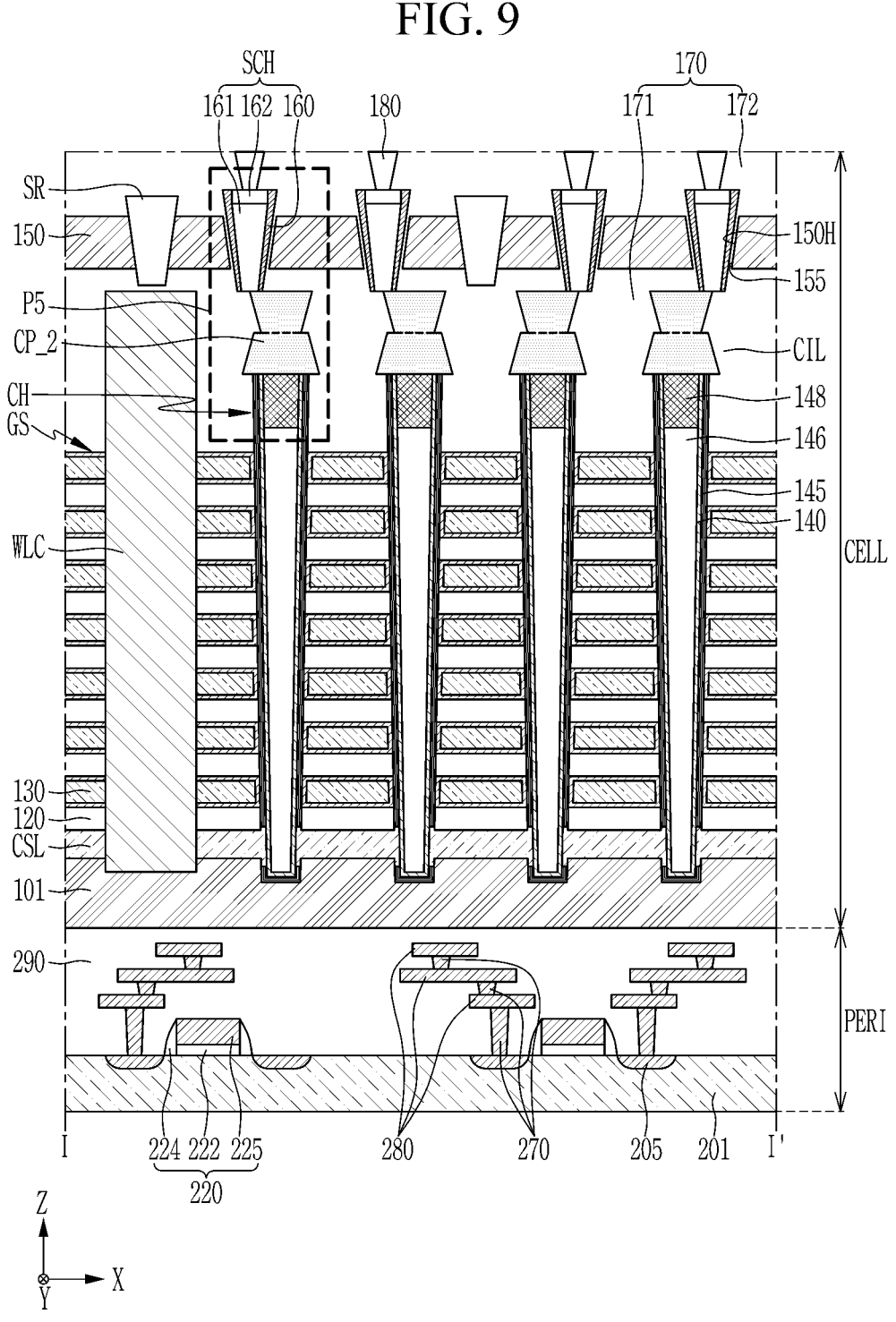
FIG. 9 illustrates a cross-sectional view taken along line I-I' of FIG. 2 according to an embodiment.
Figure 10:
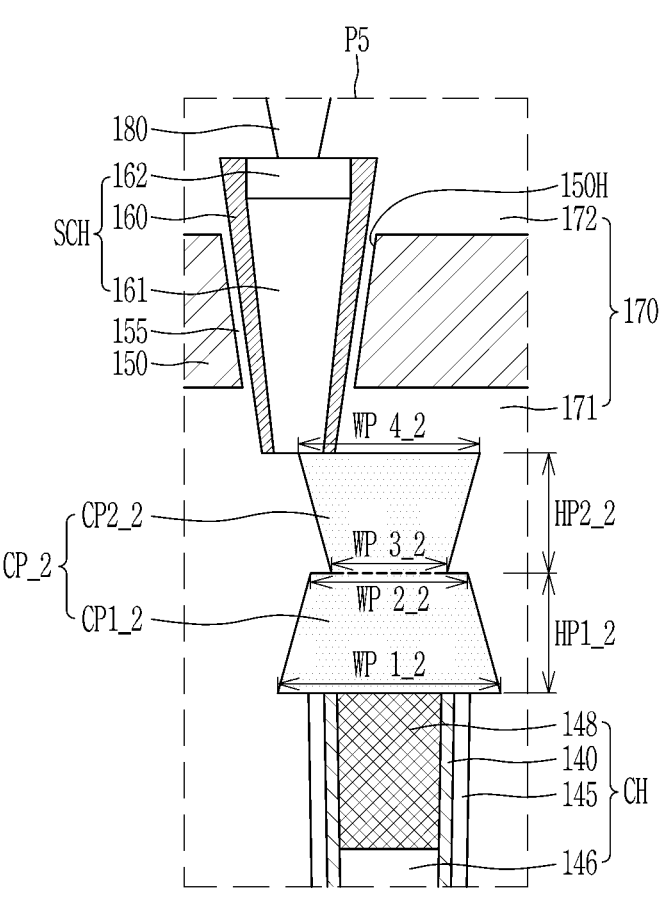
FIG. 10 illustrates a partial enlarged view of area "P5" of FIG. 9.
Figure 11:
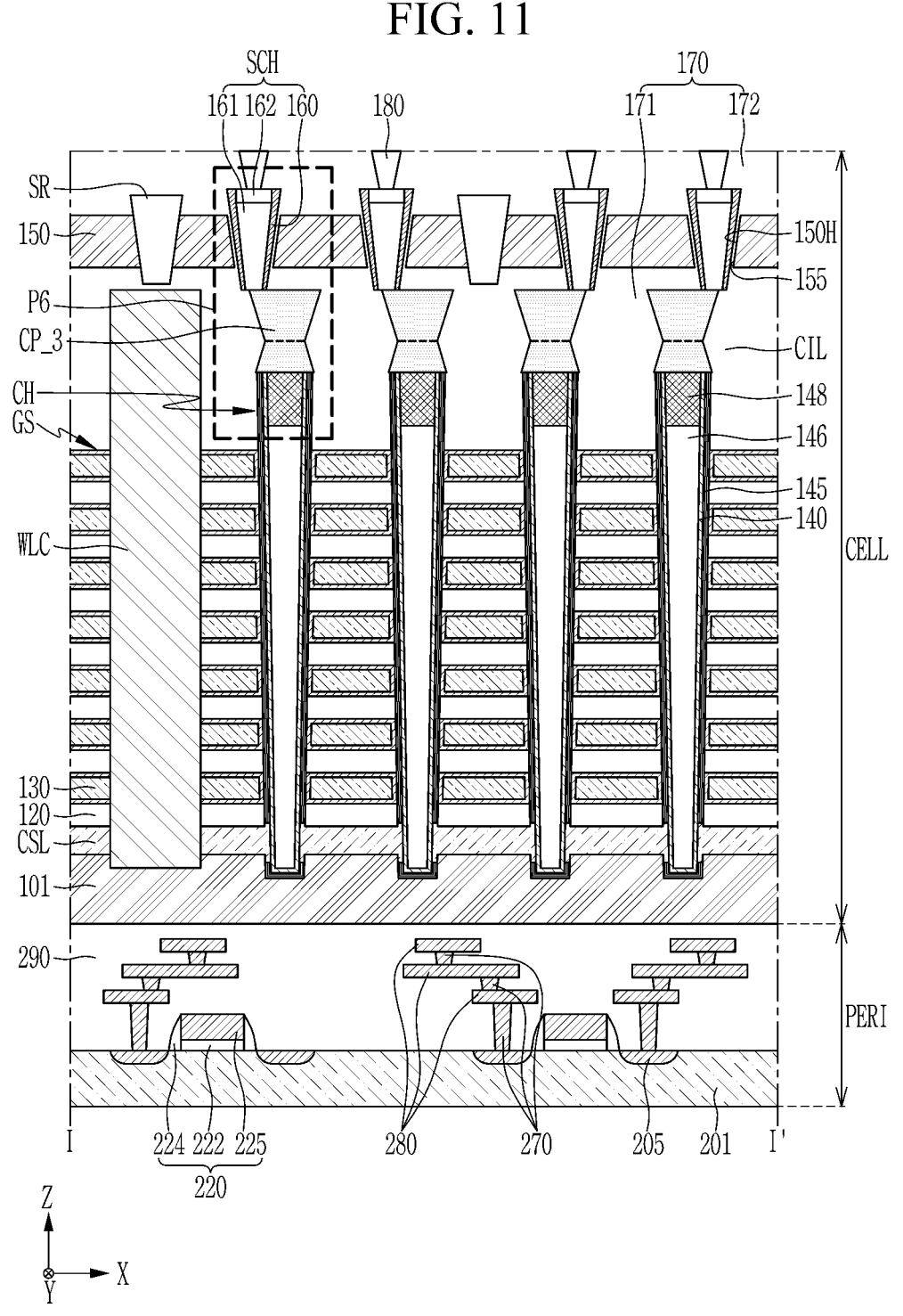
FIG. 11 illustrates a cross-sectional view taken along line I-I' of FIG. 2 according to an embodiment.
Figure 12:
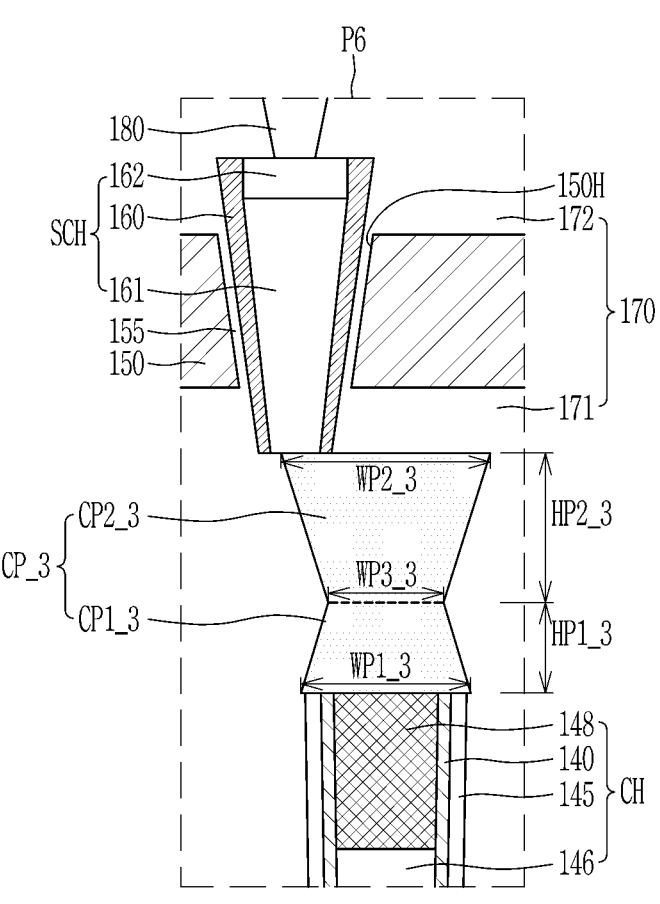
FIG. 12 illustrates a partial enlarged view of area "P6" of FIG. 11.

FIG. 7 illustrates a cross-sectional view taken along line I-I' of FIG. 2 according to an embodiment. FIG. 8 illustrates a partial enlarged view of area "P4" of FIG. 7. FIG. 9 illustrates a cross-sectional view taken along line I-I' of FIG. 2 according to an embodiment. FIG. 10 illustrates a partial enlarged view of area "P5" of FIG. 9. FIG. 11 illustrates a cross-sectional view taken along line I-I' of FIG. 2 according to an embodiment. FIG. 12 illustrates a partial enlarged view of area "P6" of FIG. 11.

Referring to FIG. 7 to FIG. 12, contact pads CP_1, CP_2, and CP_3 may have different shapes form contact pads CP of FIGS. 3 and 4.

In FIG. 7 and FIG. 8, the contact pads CP_1 include a first portion CP1_1 and a second portion CP2_2, and the first portion CP1_1 and the second portion CP2_1 have substantially the same maximum width, but may have different heights. Accordingly, areas of the first portion CP1_1 and the second portion CP2_1 of the contact pad CP_1 may be different.

A lower surface of the first portion CP1_1 of the contact pad CP_1 contacting the channel structures CH may have a first width WP1_1 in the first direction (X direction), an upper surface of the second portion CP2_1 contacting the string select structure SCH may have a second width WP2_1 in the first direction (X direction), and a portion in which an upper surface of the first portion CP1_1 and a lower surface of the second portion CP2_1 are in contact with and connected with each other may have a third width WP3_1 in the first direction (X direction).

The first width WP1_1 and the second width WP2_1 may be substantially the same, and the first width WP1_1 and the second width WP2_1 may be larger than the third width WP3_1.

The first portion CP1_1 may have a first height HP1_1 in the third direction (Z direction), and the second portion CP2_1 may have a second height HP2_1 in the third direction (Z direction).

A value of the first height HP1_1 may be smaller than a value of the second height HP2_1. Accordingly, the first portion CP1_1 and the second portion CP2_1 of the contact pad CP_1 may have different areas. However, the disclosure is not limited thereto, and may be variously changed. For example, in some embodiments, as the value of the first height HP1_1 is larger than the value of the second height HP2_1, the area of the first portion CP1_1 may be larger than the area of the second portion CP2_1.

A slope of a side surface of the first portion CP1_1 of the contact pad CP_1 may be larger than a slope of a side surface of the second portion CP2_1. That is, an angle between the lower surface and the side surface of the first portion CP1_1 may be larger than an angle between the upper surface and the side surface of the second portion CP2_1.

Accordingly, a rate of decrease in the width of the first portion CP1_1 that decreases toward the string select channel structure SCH from the channel structure CH may be greater than a rate of increase in the width of the second portion CP2_1 that increases from the channel structure CH toward the string select channel structure SCH.

In FIG. 9 and FIG. 10, the contact pads CP_2 include a first portion CP1_2 and a second portion CP2_2, and the first portion CP1_1 and the second portion CP2_1 have substantially the same height, but may have different widths. Accordingly, areas of the first portion CP1_2 and the second portion CP2_2 of the contact pad CP_2 may be different.

As the width in the first direction (X direction) of the first portion CP1_2 of the contact pad CP_2 decreases from the channel structure CH toward the string select channel structure SCH, the first portion CP1_2 of the contact pad CP_2 may have a first width WP1_2 at the lower surface of the first portion CP1_2. The first width WP1_2 may be a maximum width of the first portion C1_2, and may have a second width WP2_2 at the upper surface of the first portion CP1_2. The second width WP2_2 may be a minimum width of the first portion C1_2.

The second portion CP2_2 of the contact pad CP_2 may contact the string select channel structures SCH. As the width in the first direction (X direction) of the second portion CP2_2 increases from the channel structures CH toward the string select channel structure SCH, the second portion CP2_2 may have a third width WP3_2 at the lower surface of the second portion CP2_2 and a fourth width WP4_2 at the upper surface of the second portion CP2_2. The third width WP3_2 may be a minimum width of the second portion CP2_2. The lower surface of the second portion CP2_2 may contact the upper surface of the first portion CP1_2. The fourth width WP4_2 may be a maximum width of the second portion CP2_2.

The first width WP1_2, the second width WP2_2, the third width WP3_2, and the fourth width WP4_2 may be different from each other. For example, as the value of the second width WP2_2, which is the minimum width of the first portion CP1_2 of the contact pad CP_2, has the value of the fourth width WP4_2, which is the maximum width of the second portion CP2_2, widths in the first direction (X direction) at an upper portion, a central portion, and a lower portion of the first portion CP1_2 may be respectively larger than widths in the first direction (X direction) at an upper portion, a central portion, and a lower portion of the second portion CP2_2.

Accordingly, the second portion CP2_2 may contact and be connected to a portion of the upper surface of the first portion CP1_2. That is, the second portion CP2_2 is disposed on the first portion CP1_2, and may expose the upper surface of the first portion CP1_2. In FIG. 9, the central axes of the first portion CP1_2 and the second portion CP2_2 coincide with each other. The present disclosure, however, is not limited thereto. In some embodiments, the central axes of the first portion CP1_2 may be staggered with the second portion CP2_2. For example, when viewed in a plan view, the central axis of the first portion CP1_2 may be spaced apart from the central axis of the second portion CP2_2.

The first portion CP1_2 may have a first height HP1_2 in the third direction (Z direction), the second portion CP2_2 may have a second height HP2_2 in the third direction (Z direction), and values of the first height HP1_2 and the second height HP2_2 may be substantially the same.

Accordingly, the first portion CP1_2 and the second portion CP2_2 of the contact pad CP_2 may have different areas. However, the disclosure is not limited thereto, and may be variously changed. In some embodiments, as the value of the first height HP1_2 and the value of the second height HP2_2 are substantially the same and the first width WP1_2 to the fourth width WP4_2 have different values, the shapes and areas of the first portion CP1_2 and the second portion CP2_2 of the contact pad CP_2 may be variously changed. For example, the area ratio of the first portion CP1_2 and the second portion CP2_2 may be 3:7 to 4:6. However, the area ratio of the first portion CP1_2 and the second portion CP2_2 is not limited to the numerical range that is described above.

According to the embodiment as shown in FIG. 11 and FIG. 12, the contact pads CP_3 may include a first portion CP1_3 and a second portion CP2_3, a maximum width of the first portion CP1_3 and a maximum width of the second portion CP2_3 may be different, and a height HP1_3 of the first portion CP1_3 and a height HP2_3 of the second portion CP2_3 may be different. Accordingly, areas of the first portion CP1_3 and the second portion CP2_3 of the contact pad CP_3 may be different.

Specifically, a lower surface of the first portion CP1_3 of the contact pad CP_3 contacting the channel structures CH may have a first width WP1_3 in the first direction (X direction), an upper surface of the second portion CP2_3 contacting the string select channel structure SCH may have a second width WP2_3 in the first direction (X direction), and a portion in which an upper surface of the first portion CP1_3 and a lower surface of the second portion CP2_3 are in contact with and connected with each other may have a third width WP3_3 in the first direction (X direction).

The value of the first width WP1_3 may be smaller than the value of the second width WP2_3, and the values of the first width WP1_3 and the second width WP2_3 may be greater than the value of the third width WP3_3. However, the disclosure is not limited thereto, and in some embodiments, the value of the first width WP1_3 may be greater than the value of the second width WP2_3.

The first portion CP1_3 may have the first height HP1_3 in the third direction (Z direction), and the second portion CP2_3 may have the second height HP2_3 in the third direction (Z direction).

The value of the first height HP1_3 may be smaller than the value of the second height HP2_3. However, the disclosure is not limited thereto, and in some embodiments, the first height HP1_3 may be greater than the second height HP2_3.

Figure 13:
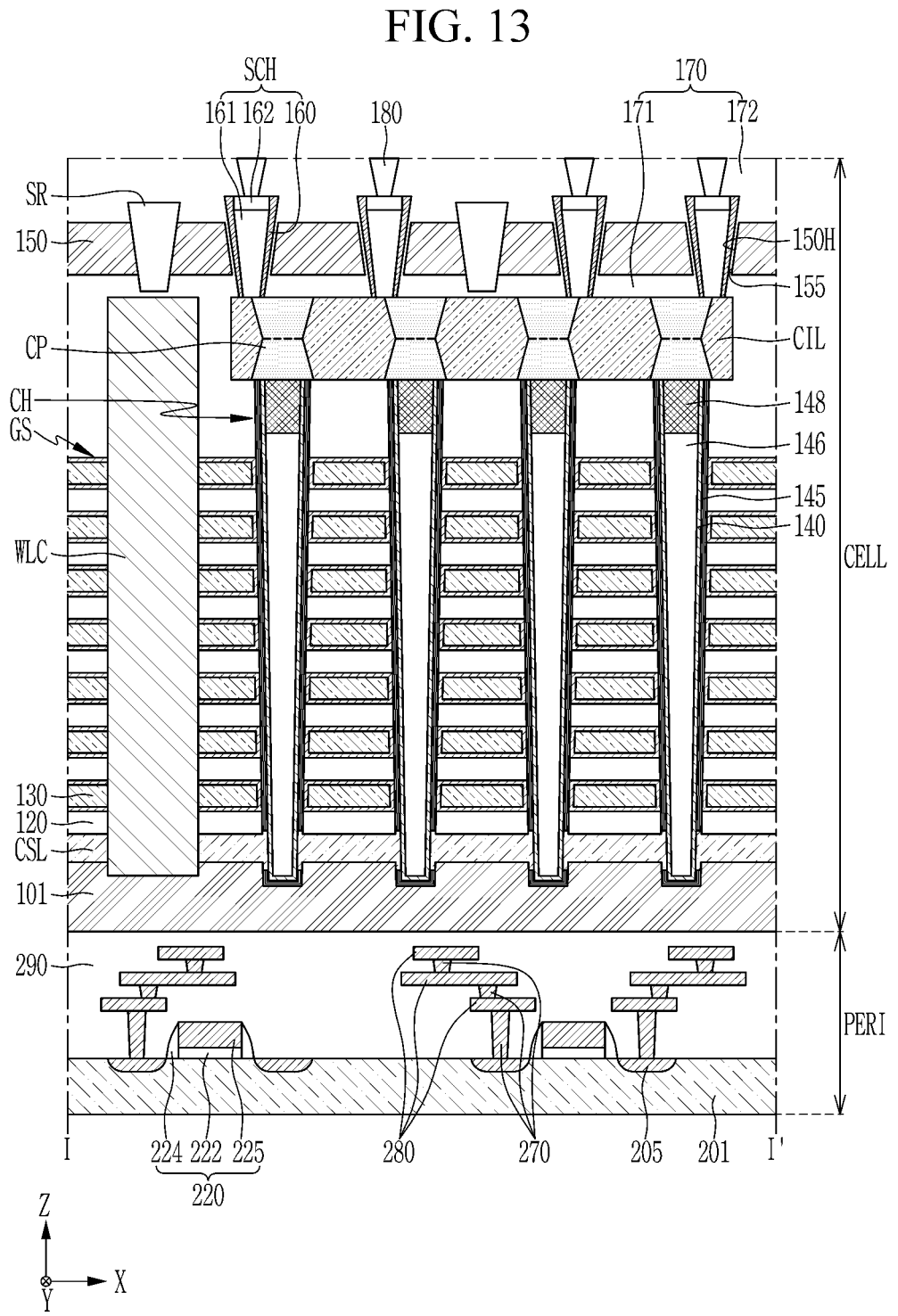
FIG. 13 illustrates a cross-sectional view taken along line I-I' of FIG. 2 according to an embodiment.
Figure 14:
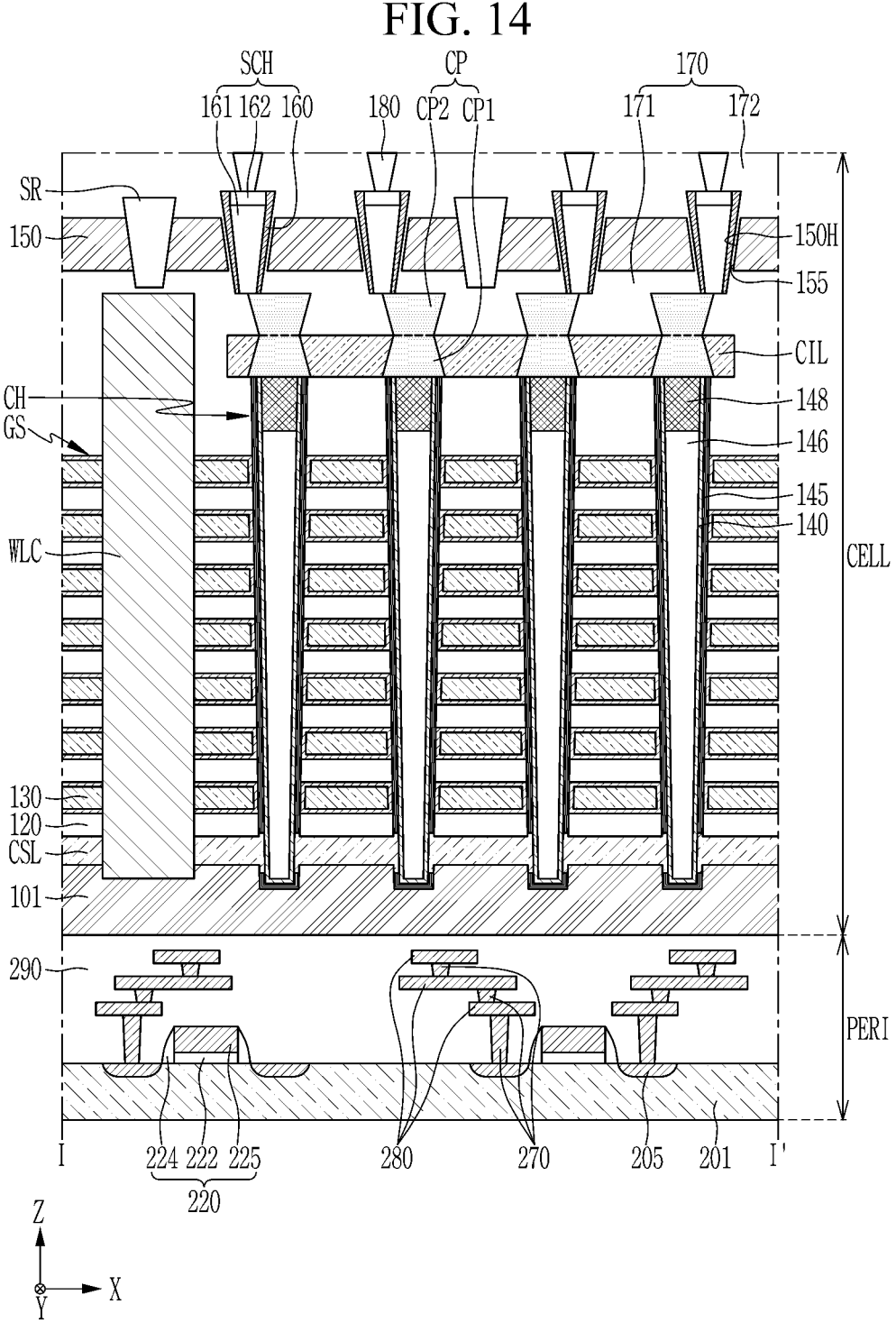
FIG. 14 illustrates a cross-sectional view taken along line I-I' of FIG. 2 according to an embodiment.

FIG. 13 illustrates a cross-sectional view taken along line I-I' of FIG. 2 according to an embodiment. FIG. 14 illustrates a cross-sectional view taken along line I-I' of FIG. 2 according to an embodiment.

According to the embodiment as shown in FIG. 13 and FIG. 14, unlike the embodiment shown in FIG. 3, the semiconductor device 100 of FIGS. 1 and 2 may further include a contact pad insulating layer CIL surrounded by the first upper insulating layer 171. According to the embodiment as shown in FIG. 13, the contact pad insulating layer CIL may contact the side surfaces of the contact pads CP, and the contact pad insulating layer CIL may be surrounded by the first upper insulating layer 171.

Specifically, the contact pad insulating layer CIL may extend in the second direction (Y direction), may be alternately disposed with the contact pads CP along the first direction (X direction), and may contact opposite side surfaces of the contact pads CP.

An upper surface, a lower surface, and a side surface of the contact pad insulating layer CIL may contact the first upper insulating layer 171, and may be surrounded by the first upper insulating layer 171. The upper surface of the contact pad insulating layer CIL may be disposed on substantially the same line as the upper surface of the contact pad CP, and the lower surface of the contact pad insulating layer CIL may be disposed on substantially the same line as the lower surface of the contact pad CP. However, the disclosure is not limited thereto, and may be variously changed. For example, in some embodiments, the upper surface of the contact pad insulating layer CIL may be disposed higher than the upper surface of the contact pad CP, and the lower surface of the contact pad insulating layer CIL may be disposed lower than the lower surface of the contact pad CP.

The contact pad insulating layer CIL may include or may be formed of a different material from that of the first upper insulating layer 171. For example, the first upper insulating layer 171 may include or may be formed of an insulating material such as a silicon oxide, and the contact pad insulating layer CIL may include or may be formed of an insulating material such as a silicon nitride. However, the disclosure is not limited thereto, and may be variously changed.

In FIG. 14, the disposition of the contact pad insulating layer CIL is different from that of FIG. 13.

The contact pad insulating layer CIL may contact the side surfaces of the first portion CP1 of each of the contact pads CP, and may not contact the side surfaces of the second portion CP2 of each of the contact pads CP.

The contact pad insulating layer CIL may extend in the second direction (Y direction), may be alternately disposed with the first portion CP1 of each of the contact pads CP along the first direction (X direction), and may contact the side surfaces of the first portion CP1 of each of the contact pads CP.

The upper surface of the contact pad insulating layer CIL may be disposed on the substantially same line as the upper surface of the first portion CP1 of the contact pad CP. For example, the upper surface of the contact pad insulating layer CIL may be coplanar with the upper surface of the first portion CP1 of the contact pad CP. The lower surface of the contact pad insulating layer CIL may be disposed on substantially the same line as the lower surface of the first portion CP1 of the contact pad CP. For example, the lower surface of the contact pad insulating layer CIL may be coplanar with the lower surface of the first portion CP1 of the contact pad CP. The present disclosure, however, is not limited thereto. For example, in some embodiments, the upper surface of the contact pad insulating layer CIL may be disposed higher than the upper surface of the first portion CP1 of the contact pad CP, and thus, the contact pad insulating layer CIL may contact at least some of side surfaces of the second portion CP2 of the contact pad CP.

Even in the case of the embodiment as shown in FIG. 7 to FIG. 14, as the upper surfaces of the contact pads CP_1 and CP_2 contacting the string select channel structures SCH are widened, the contact pads CP_1 and CP_2 may more stably contact the string select channel structures SCH, and the channel structures CH and the string select channel structures SCH may be more stably electrically connected by the contact pads CP_1 and CP_2.

Hereinafter, a manufacturing method of a semiconductor device will be described with reference to FIG. 15 to FIG. 28. Hereinafter, the same components as those in the previously described embodiment are denoted by the same reference numerals, and redundant descriptions thereof will be omitted or simplified, and differences will be mainly described.

FIG. 15 to FIG. 22 illustrate cross-sectional views for explaining a manufacturing method of a semiconductor device according to an embodiment.

Figure 15:
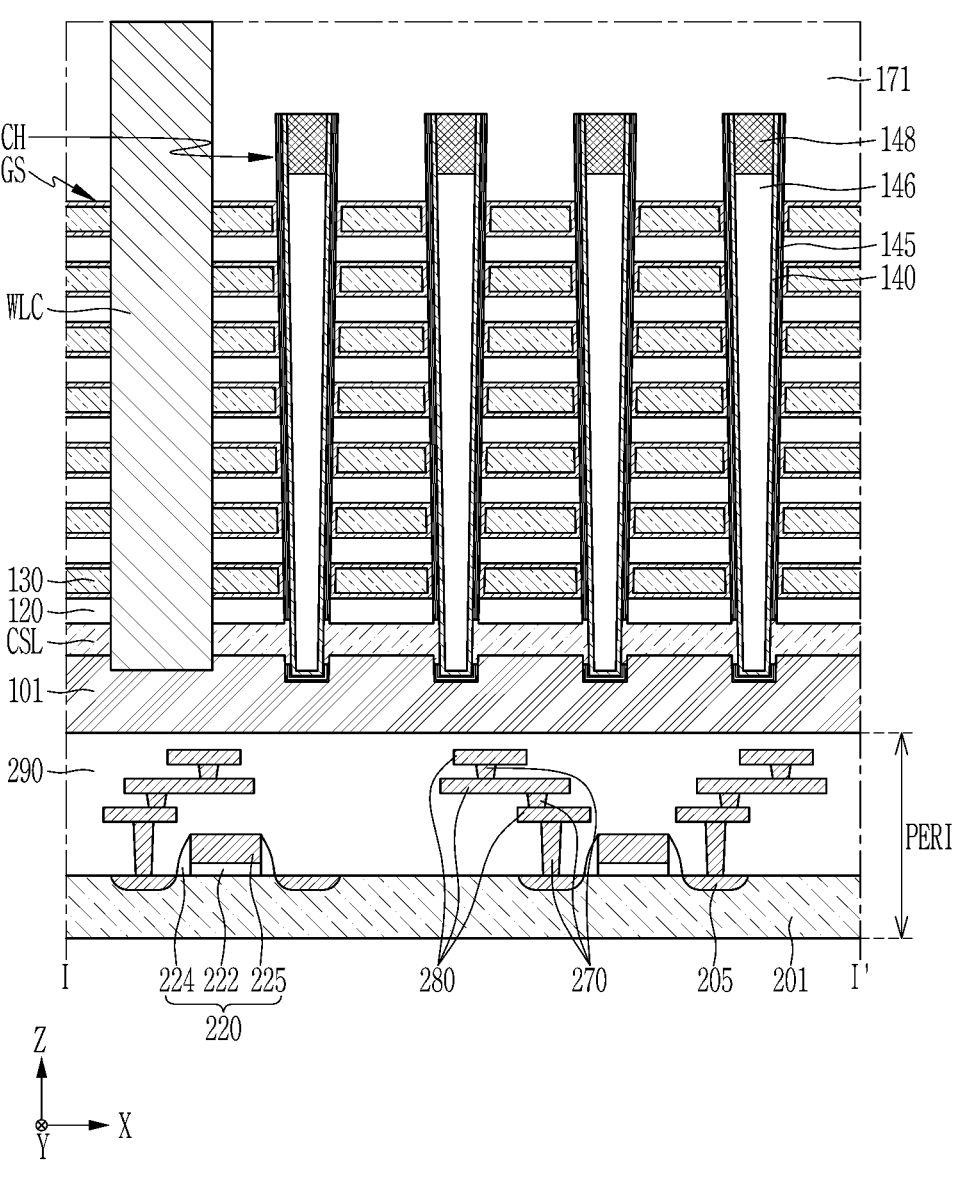

Referring to FIG. 15, first, a first stacked structure disposed on the above-described peripheral circuit area PERI is prepared. The first stacked structure may include the substrate 101, the gate layers 130 spaced apart from each other and vertically stacked on the substrate 101, and the interlayer insulating layers 120 alternately stacked with the gate layers 130.

The first stacked structure may extend into the substrate 101 while penetrating the gate layers 130, the interlayer insulating layers 120, and the common source line CSL, and may include the channel structures CH in which the channel layer 140 extending in a direction substantially perpendicular to the upper surface of the substrate 101 is disposed therein, the word line cut WLC extending through the stacked structure GS of the interlayer insulating layers 120 and the gate layer 130 and the common source line CSL, and the upper insulating layer 170 disposed on the gate layers 130. Since various methods of forming the first stacked structure are widely known in the art, a description thereof will be omitted.

Figure 16:
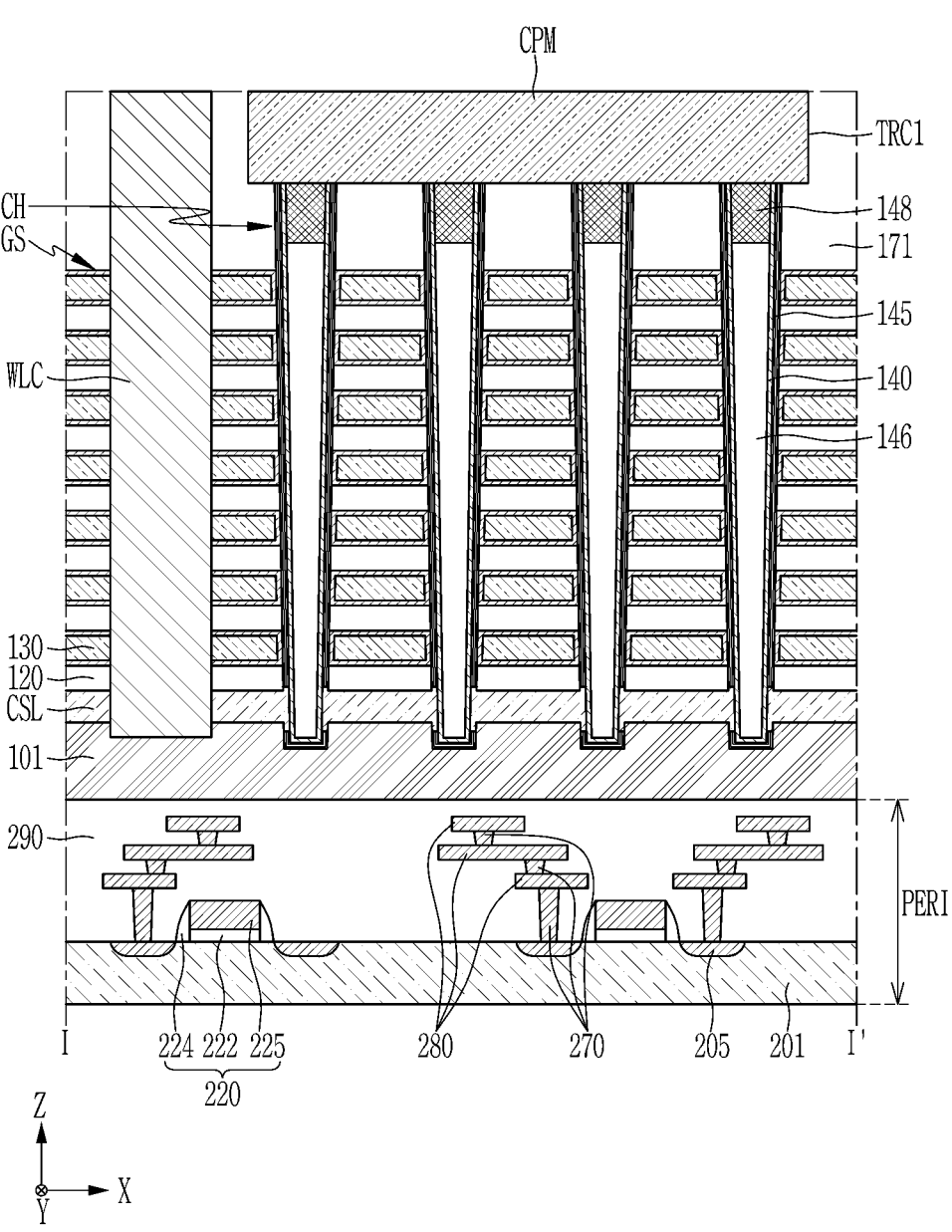

Subsequently, referring to FIG. 16, the first upper insulating layer 171 may be etched so that the upper surfaces of the channel structures CH are exposed. Specifically, by etching a portion of the first upper insulating layer 171 disposed on the channel structures CH from the upper surface toward the channel structure CH from the first upper insulating layer 171 so that the upper surfaces of the channel pads 148 disposed on the channel structures CH are exposed, a first trench TRC1 having a horizontal width in the first direction (X direction) and the vertical width in the third direction (Z direction) may be formed.

Subsequently, a contact pad material layer CPM may be formed in the first trench TRC1. Specifically, as the contact pad material layer CPM is formed in the first trench TRC1, a lower surface of the contact pad material layer CPM may contact the upper surfaces of the channel pads 148, and a side surface of the contact pad material layer CPM may contact an inner wall of the first trench TRC1.

The contact pad material layer CPM may include or may be formed of doped polysilicon, metal, a conductive metal nitride, a conductive metal silicide, a conductive metal oxide, or a combination thereof. For example, the contact pad material layer CPM may include or may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto.

Figure 17:
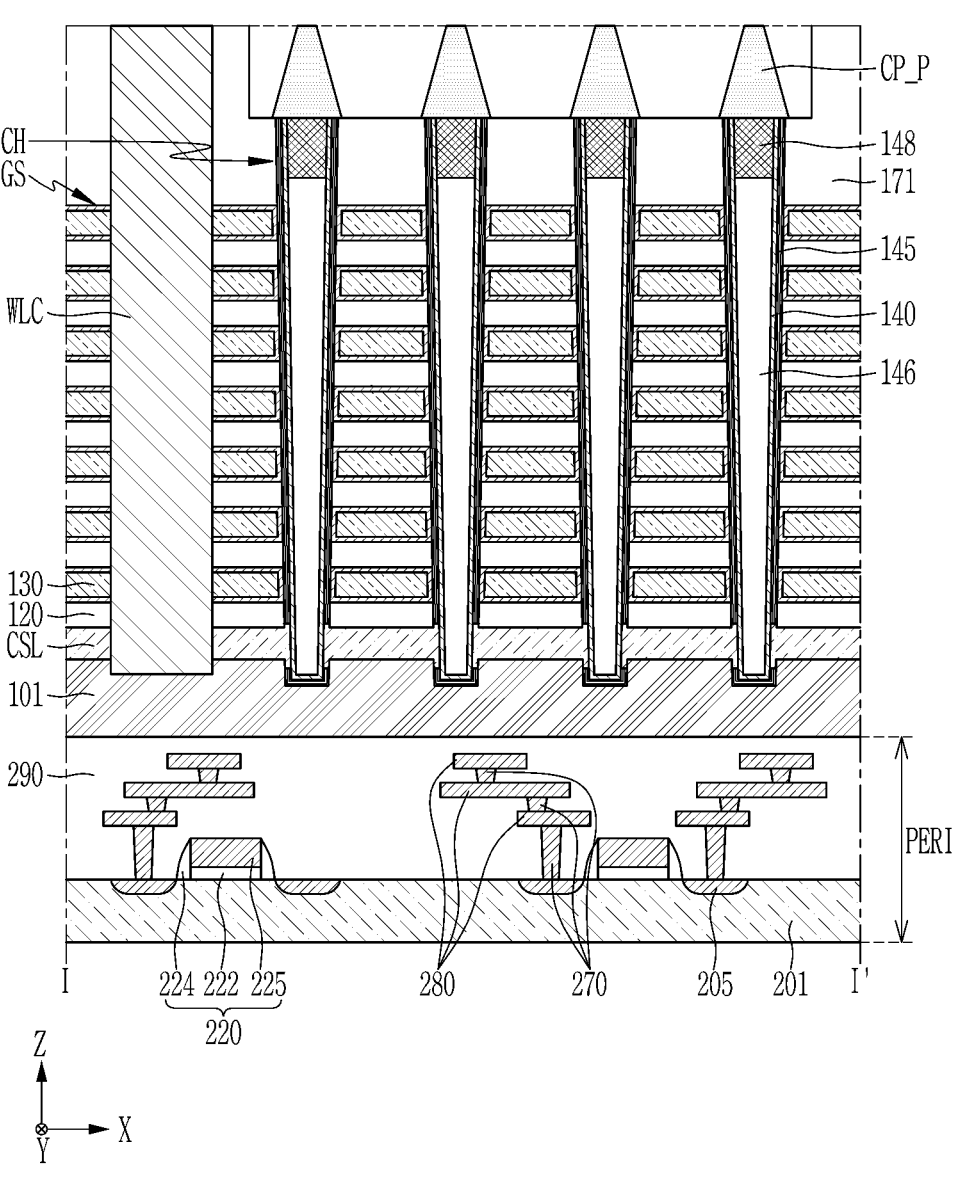

Subsequently, referring to FIG. 17, preliminary contact pads CP_P may be formed by etching the contact pad material layer CPM.

Specifically, by anisotropically etching the contact pad material layer CPM, the preliminary contact pads CP_P may be patterned to be disposed on the channel structures CH. Each of the preliminary contact pads CP_P may have a shape in which a width in the first direction (X direction) decreases from the lower surface thereof to the upper surface thereof.

The lower surface of each of the preliminary contact pads CP_P may contact the upper surfaces of the channel pads 148 that are included in the channel structures CH. The central axes of the preliminary contact pads CP_P may coincide with the central axes of the channel structures CH.

Figure 18:
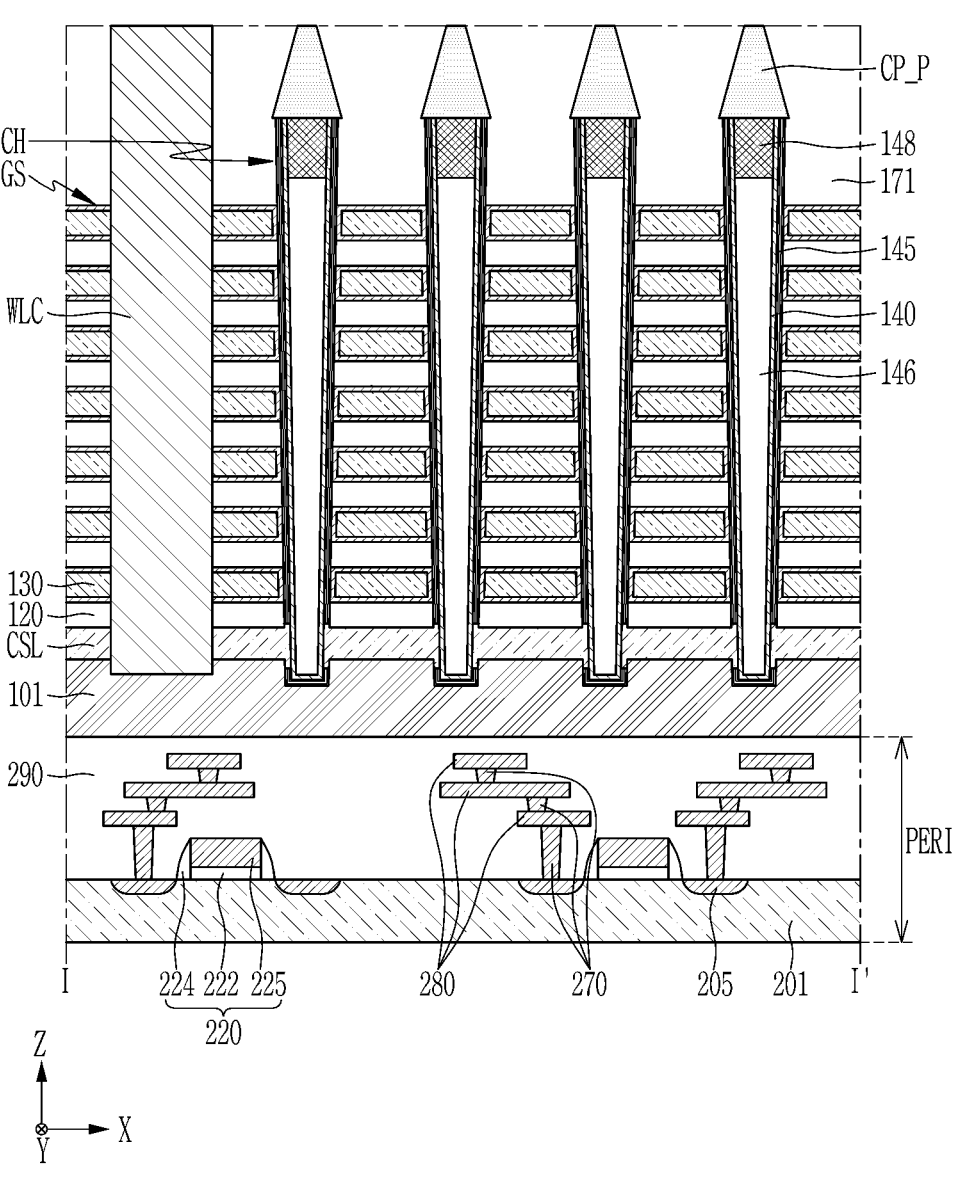

Next, referring to FIG. 18, in the step of etching the contact pad material layer CPM to form the preliminary contact pads CP_P, the first upper insulating layer 171 is formed in an area from which the contact pad material layer CPM is removed, and then a chemical mechanical polishing (CMP) process may be performed.

Specifically, as the first upper insulating layer 171 is filled in the area from which the contact pad material layer CPM is removed, the first upper insulating layer 171 may contact the side surfaces of each of the preliminary contact pads CP_P.

In some embodiments, a contact pad insulating layer CIL including a different material from that of the first upper insulating layer 171 may be formed in the area from in which the contact pad material layer CPM is removed. For example, the first upper insulating layer 171 may include or may be formed of an insulating material such as a silicon oxide, and the contact pad insulating layer CIL may include or may be formed of an insulating material such as a silicon nitride. The present disclosure, however, is not limited thereto. In some embodiments, the first upper insulating layer 171 may include or may be formed of an insulating material such as a silicon nitride, and the contact pad insulating layer CIL may include or may be formed of an insulating material such as a silicon oxide.

Subsequently, referring to FIG. 19, the first portion CP1 of the contact pad CP may be formed by etching a portion of the preliminary contact pad CP_P.

The first portion CP1 of the contact pad CP may be formed by anisotropically etching a portion of the contact pad material layer CPM from the upper surface thereof toward the lower surface thereof.

As a portion of the preliminary contact pad CP_P is etched, a second trench TRC2 extending in the third direction (Z direction) may be formed at an upper portion of the first portion CP1 of the contact pad CP. That is, the second trench TRC2 may expose the upper surface of the first portion CP1 of the contact pad CP, may expose the inner sidewall of the first upper insulating layer 171, and may have a shape in which a width in the first direction (X direction) decreases from the upper surface of the first portion CP1 toward an upper direction thereof. Accordingly, the inner sidewall of the first upper insulating layer 171 contacting the second trench TRC2 may include a reverse tapered slope.

Figure 20:
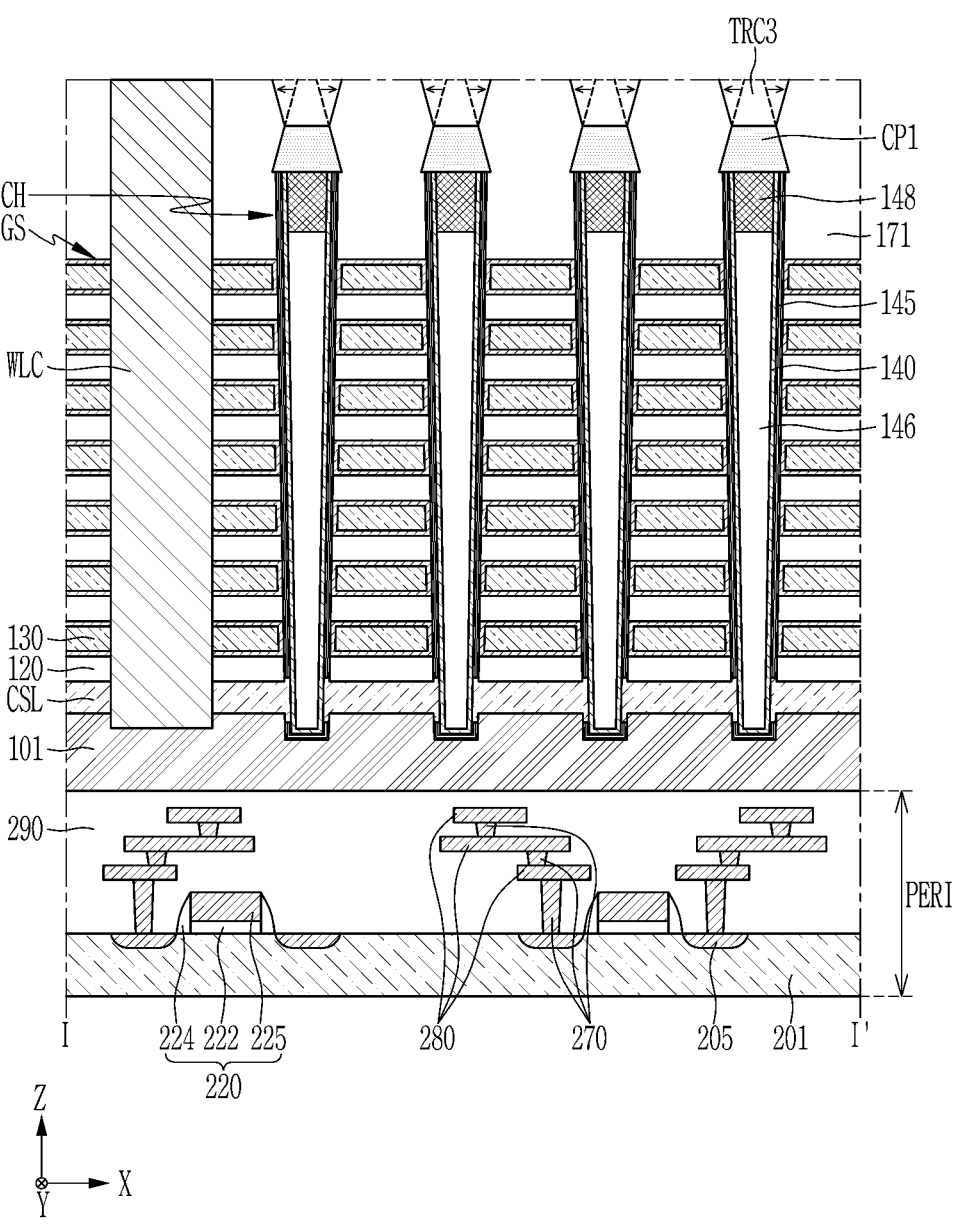

Subsequently, referring to FIG. 20, a third trench TRC3 may be formed by etching a portion of the inner sidewall of the second trench TRC2.

Specifically, the third trench TRC3 may be formed by extending the second trench TRC2 to one side and the other side in the first direction (X direction) by etching a portion of the first upper insulating layer 171 forming the inner sidewall of the second trench TRC2. Accordingly, the width of the third trench TRC3 may increase in the first direction (X direction) from the upper surface of the first portion CP1 of the contact pad CP toward the upper portion of the third trench TRC3, and the inner sidewall of the first upper insulating layer 171 contacting the third trench TRC3 may have a positive tapered inclined surface.

In the step of forming the third trench TRC3 by etching a portion of the first upper insulating layer 171 forming the inner sidewall of the second trench TRC2 according to the embodiment, a portion of the first upper insulating layer 171 forming the inner sidewall of the second trench TRC2 may be wet etched by using an etchant that selectively etches the first upper insulating layer 171. The present disclosure, however, is not limited thereto. In some embodiments, a method of etching a portion of the first upper insulating layer 171 forming the inner sidewall of the second trench TRC2 may be variously changed.

Figure 21:
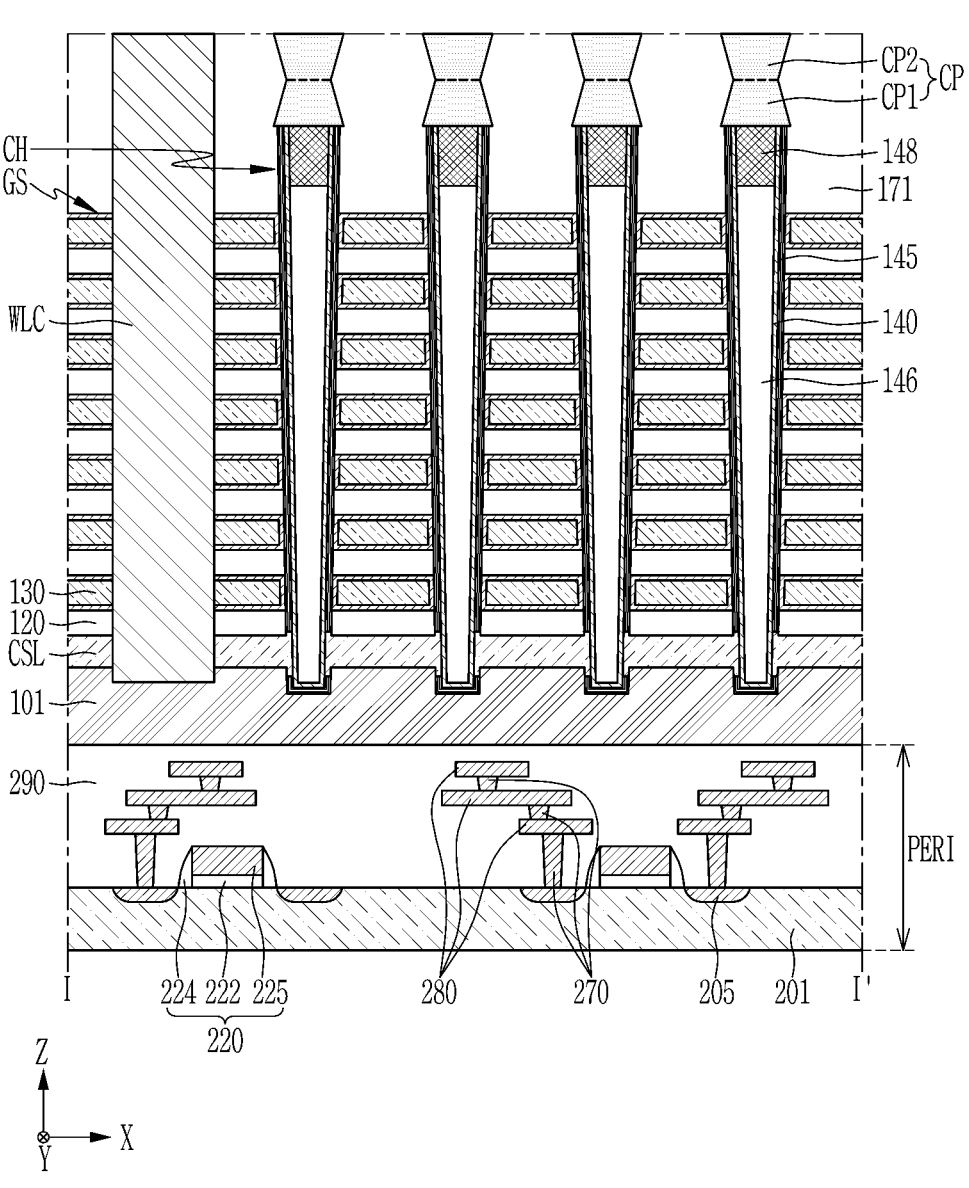

Subsequently, referring to FIG. 21, the second portion CP2 of the contact pad CP may be formed on the first portion CP1 of the contact pad CP.

The second portion CP2 of the contact pad CP including the same material as the first portion CP1 of the first contact pad CP may be formed in the third trench TRC3. The present disclosure, however, is not limited thereto. In some embodiments, the first portion CP1 and the second portion CP2 of the contact pad CP may include or may be formed of different materials.

As the second portion CP2 of the contact pad CP is formed in the third trench TRC3, the second portion CP2 of the contact pad CP may have substantially the same shape as the third trench TRC3. That is, the width in the first direction (X direction) may increase from the lower surface of the second portion CP2 contacting the first portion CP1 of the contact pad CP toward the upper surface thereof.

Subsequently, referring to FIG. 22, a second stacked structure that passes through the string select gate layer 150, is connected to the channel structures CH, and includes the string select channel structure SCH may be formed on the contact pad CP. In this case, the central portion of the channel structure CH may be staggered with the central portion of the string select channel structure SCH.

Figure 22:
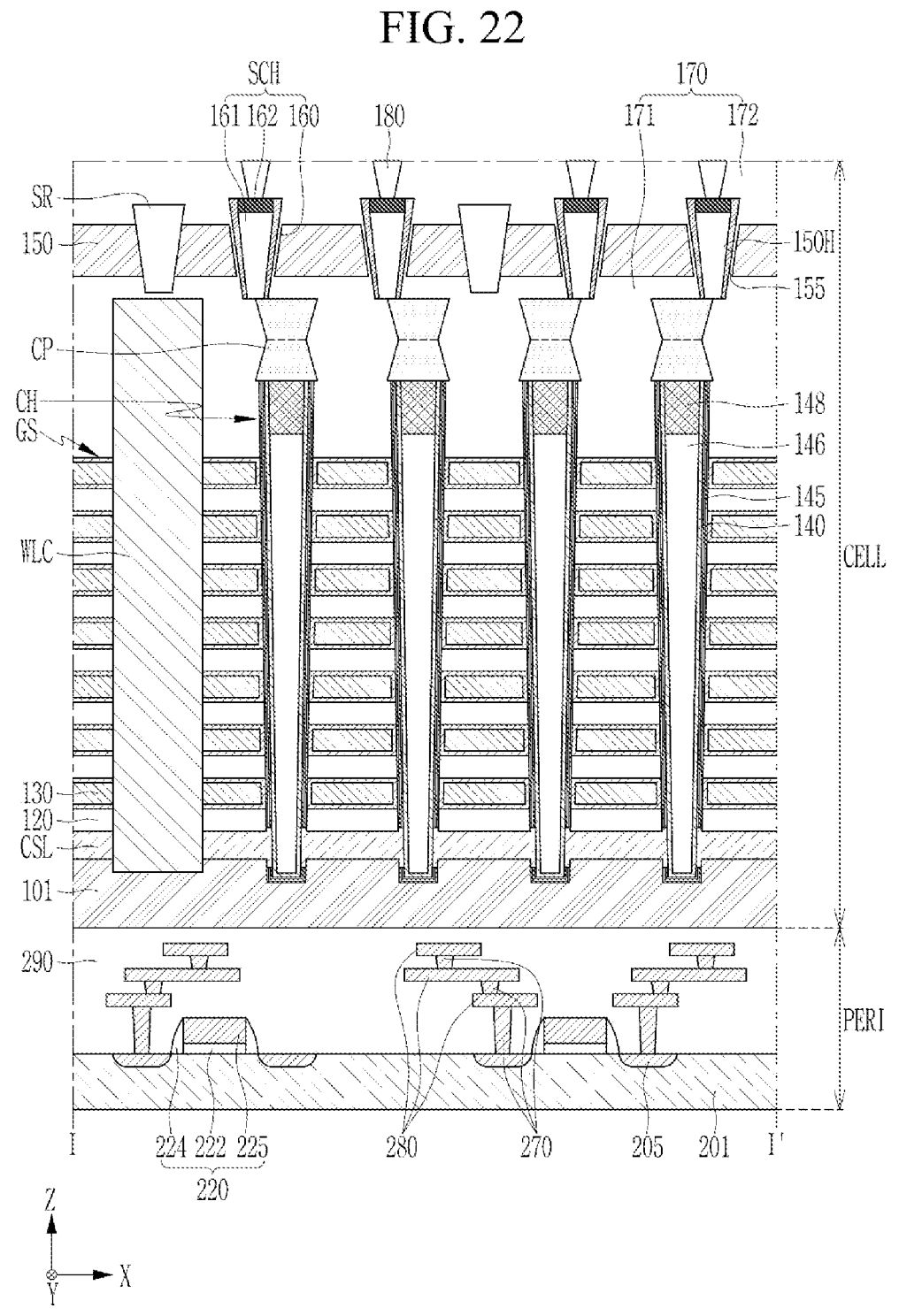

Referring to FIG. 22, the first upper insulating layer 171 covering the contact pads CP may be formed on the contact pads CP, and the string select gate layer 150 disposed on the first upper insulating layer 171 may be formed.

The string select gate layer 150 may include or may be formed of a semiconductor material such as a polycrystalline silicon and a single crystal silicon, and the semiconductor material may be an undoped material or a material including p-type or n-type impurities.

Subsequently, the string separation structures SR that separate the string select gate layers 150 from each other in the first direction (X direction) and penetrate the string select gate layer 150 are formed, and the second upper insulating layer 172 covering the string select gate layer 150 and the string separation structure SR is formed, and then through-holes penetrating the string select gate layer 150 and the second upper insulating layer 172 may be formed.

Specifically, the string separation structures SR may be disposed on the contact pads CP while not overlapping the contact pads CP in the third direction (Z direction). That is, the string separation structures SR are disposed along the first direction (X direction), and may be disposed between contact pads CP. Some of the string separation structures SR may overlap the word line cut WLC in the third direction (Z direction).

Subsequently, the second upper insulating layer 172 covering the string select gate layer 150 and the string separation structure SR may be formed. In some embodiments, the second upper insulating layer 172 may be a layer that is formed on the string select gate layer 150 together with the string separation structure SR and of which an upper portion is then planarized. The present disclosure, however, is not limited thereto. In some embodiments, the formation process of the second upper insulating layer 172 may be variously changed.

The through-holes penetrating the string select gate layer 150 and the upper insulating layer 170 may be formed through anisotropic etching, and the through-holes may be formed to expose the upper surfaces of the contact pads CP, and a plurality of string select gate holes 150H may be formed in the string select gate layer 150 by the through-holes.

The central axis of each of the through holes may be staggered with the central axis of each of the contact pads CP in the third direction (Z direction). When viewed in a plan view, the central axis of each of the through holes may be spaced apart from the central axis of each of the contact pads CP in the first direction (X direction). That is, some of the through-holes including the string select gate holes 150H may be staggered from the central axis of the contact pad CP in the third direction (Z direction) to one side in the first direction (X direction), and some of the through-holes including the string select gate holes 150H may staggered from the central axis of the contact pad CP in the third direction (Z direction) to the other side of the first direction (X direction).

Subsequently, the string select gate insulating layer 155 covering the inner sidewalls of the string select gate holes 150H may be formed.

Specifically, the string select gate insulating layer 155 may be formed to have a uniform thickness according to the shape of the inner sidewalls of the through-holes including the string select gate holes 150H, and may be connected to the first upper insulating layer 171 and the second upper insulating layer 172.

The string select gate insulating layer 155 may include or may be formed of the same material as the upper insulating layer 170 and, for example, may include or may be formed of an insulating material such as a silicon oxide and a silicon nitride.

The string select gate insulating layer 155 may be formed through atomic layer deposition (ALD) or chemical vapor deposition (CVD). The present disclosure, however, is not limited thereto. In some embodiments, the method of forming the string select gate insulating layer 155 on the inner sidewall of the string select gate holes 150H may be variously changed.

Figure 19:
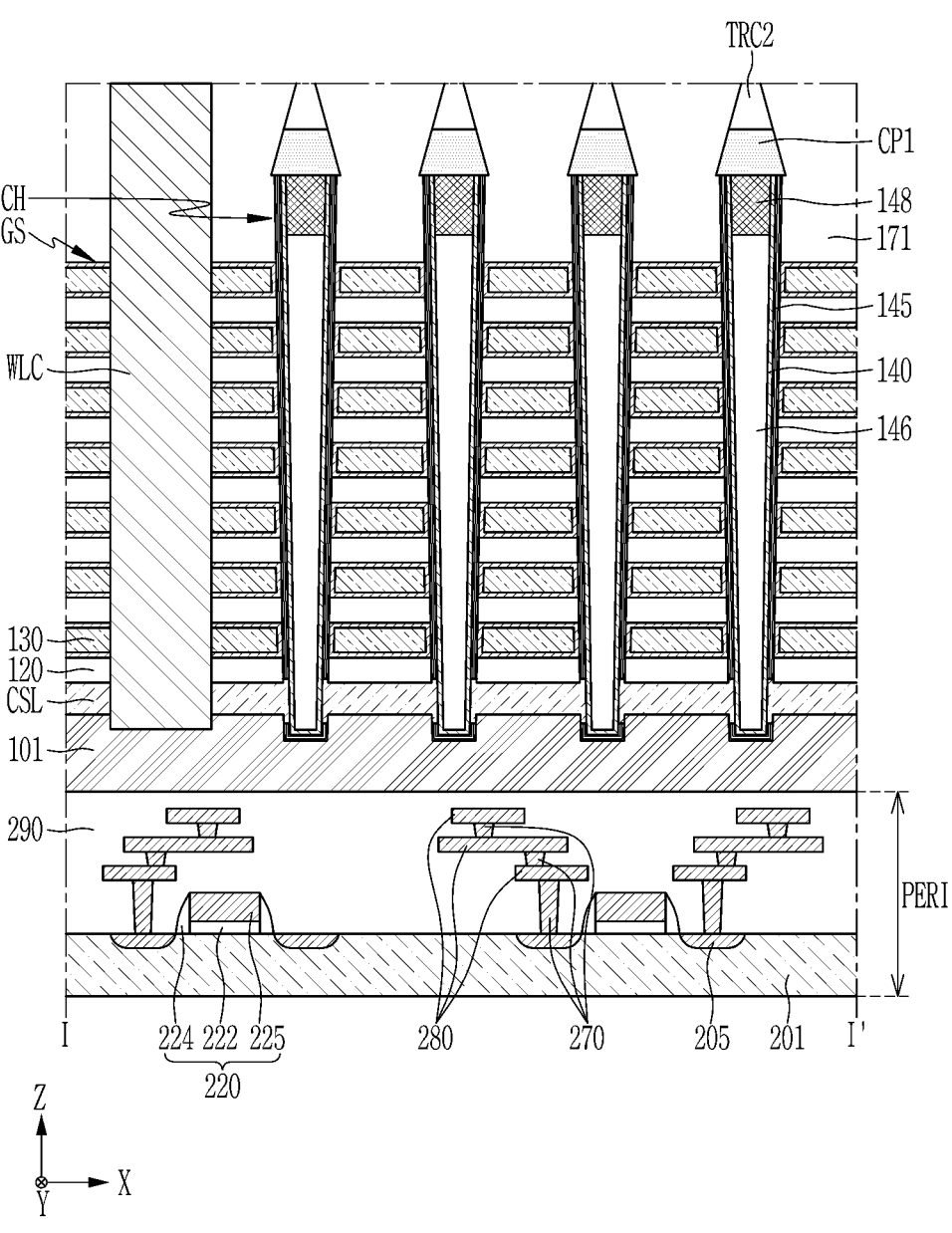

Subsequently, in the through-holes including the string select gate holes 150H, as shown in FIG. 19, the string select channel structures SCH including the string select channel layers 160, the string select insulating layers 161, and the string select channel pads 162 may be formed.

Specifically, the height of each of the string select channel structures SCH may be greater than the thickness of the string select gate holes 150H. Accordingly, the upper surface of the string select channel structure SCH may be disposed higher than the upper surface of the string select gate layer 150, and the lower surface of the string select channel structure SCH may be disposed lower than the lower surface of the string select gate layer 150.

The string select channel layer 160 is formed only on the side surfaces of the string select channel structures SCH, and it may not be formed on the upper and lower surfaces thereof, and the string select channel layer 160 may contact the gate insulating layer 155 and upper insulating layer 170. The string select channel layer 160 may include or may be formed of a semiconductor material such as a polycrystalline silicon and a single crystal silicon, and the semiconductor material may be an undoped material or a material including p-type or n-type impurities.

After the string select channel layer 160 is formed, the string select insulating layer 161 may be formed, and the string select channel pad 162 may be formed on the string select insulating layer 161.

Specifically, after the string select channel layer 160 is formed on the inner sidewall of the through-holes including the string select gate holes 150H, the through-holes are filled with an insulating material layer, and then the upper portion of the insulating material layer may be removed by an etch-back process.

Subsequently, a semiconductor material such as polycrystalline silicon configuring the string select channel pad 162 is filled in the area removed by the etch-back process, and a chemical mechanical polishing (CMP) process is performed, so that the upper surface of the string select channel pad 168 may be planarized. The process step of forming the second stacked structure on the contact pads CP is only an example, and may be variously changed.

Subsequently, after forming the second upper insulating layer 172 covering the string separation structure SR and the string select channel structure SCH, the studs 180 penetrating the second upper insulating layer 172 and contacting the string select channel structure SCH may be formed.

The studs 180 may be formed by forming holes penetrating the second upper insulating layer 172 and filling the holes with a conductive material. However, the method of forming the studs 180 is not limited thereto, and may be variously changed.

FIG. 23 to FIG. 28 illustrate cross-sectional views for explaining a manufacturing method of a semiconductor device according to an embodiment.

Figure 23:
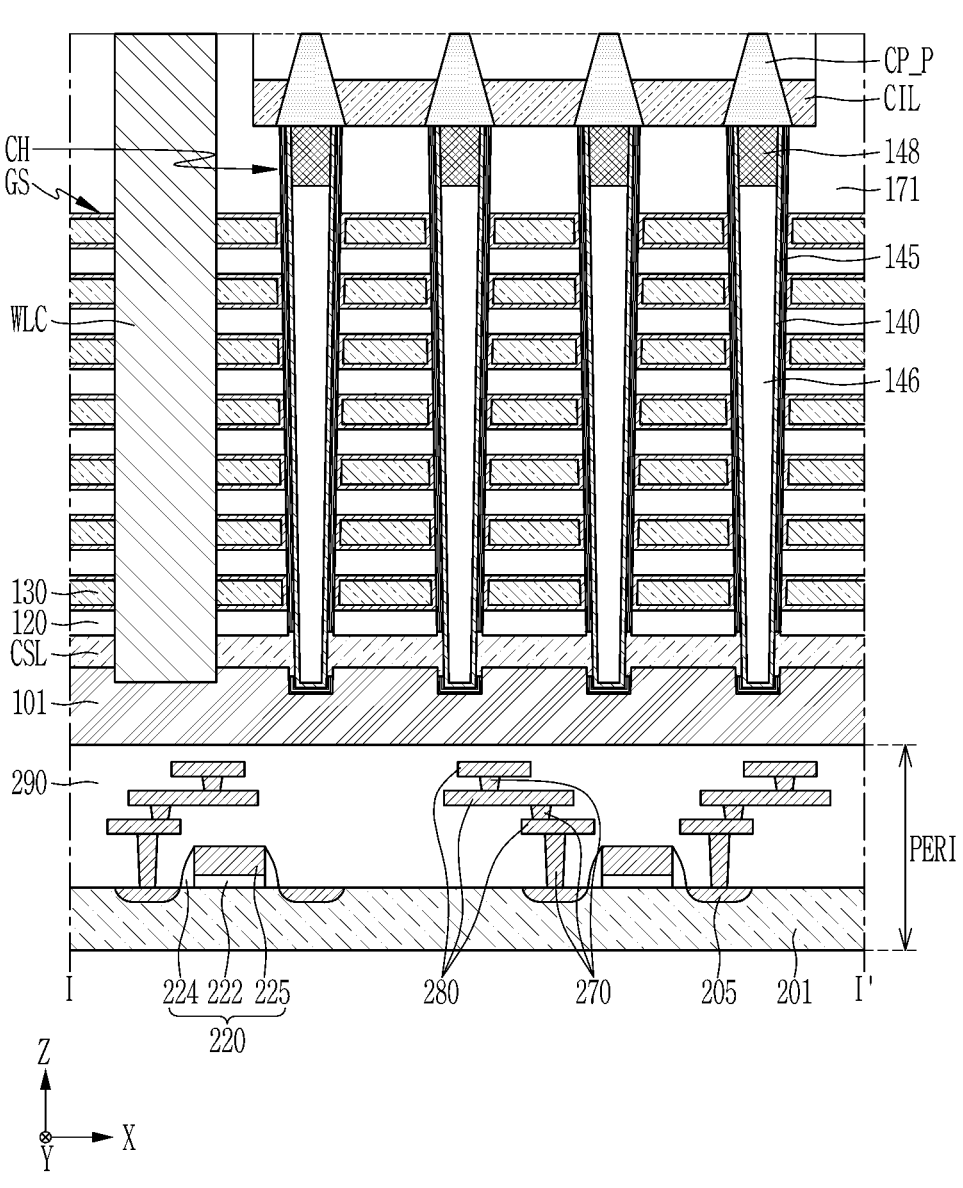
FIG. 23 to FIG. 28 illustrate cross-sectional views for explaining a manufacturing method of a semiconductor device according to an embodiment.

Referring to FIG. 23, first, the preliminary contact pads CP_P may be formed by performing substantially the same process as described above with reference to FIG. 15 to FIG. 17.

Next, unlike the process step as described above with reference to FIG. 18, the pad insulating layer CIL including a different material from that of the first upper insulating layer 171 may be formed in a portion of an area in which the contact pad material layer CPM is removed by patterning.

Specifically, the contact pad insulating layer CIL may be formed in contact with some of the side surfaces of the preliminary contact pads CP_P. That is, the contact pad insulating layer CIL may extend in the second direction (Y direction), may contact some of the side surfaces of the preliminary contact pads CP_P; and may be alternately disposed with the preliminary contact pads CP_P along the first direction (X direction).

The contact pad insulating layer CIL may include or may be formed of an insulating material such as a silicon nitride, and the first upper insulating layer 171 may include or may be formed of an insulating material such as a silicon oxide. The present disclosure, however, is not limited thereto. In some embodiments, the material of the contact pad insulating layer CIL may be variously changed.

Figure 24:
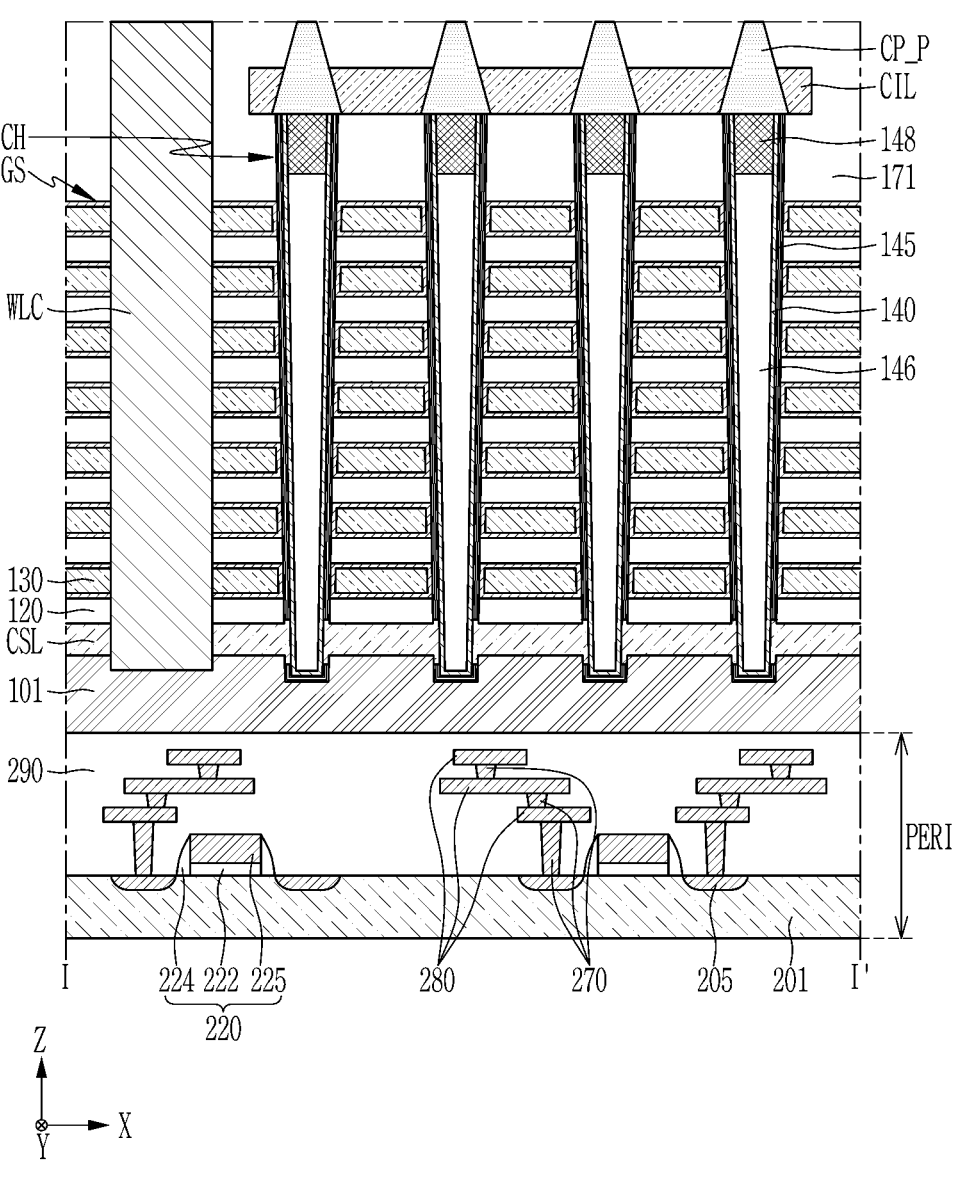

Subsequently, referring to FIG. 24, the first upper insulating layer 171 may be formed on the contact pad insulating layer CIL.

Specifically, the contact pad insulating layer CIL may be formed in a portion of an area from which the contact pad material layer CPM is removed by patterning, and the first upper insulating layer 171 may be formed in the remaining area. Accordingly, the side surfaces of the preliminary contact pads CP_P disposed below the central portion of the preliminary contact pad CP_P may contact the contact pad insulating layer CIL, and the side surfaces of the preliminary contact pads CP_P disposed at the upper portion thereof may contact the first upper insulating layer 171.

The thickness of the contact pad insulating layer CIL and the thickness of the first upper insulating layer 171 disposed on the contact pad insulating layer CIL are shown to be the same, but in some embodiments, the thickness of the contact pad insulating layer CIL and the thickness of the first upper insulating layer 171 disposed on the contact pad insulating layer CIL may be variously changed. For example, as the contact pad insulating layer CIL is formed to a height higher or lower than the center of the preliminary contact pad CP_P, the thickness of the contact pad insulating layer CIL and the thickness of the first upper insulating layer 171 disposed on the contact pad insulating layer CIL may be different.

Figure 25:
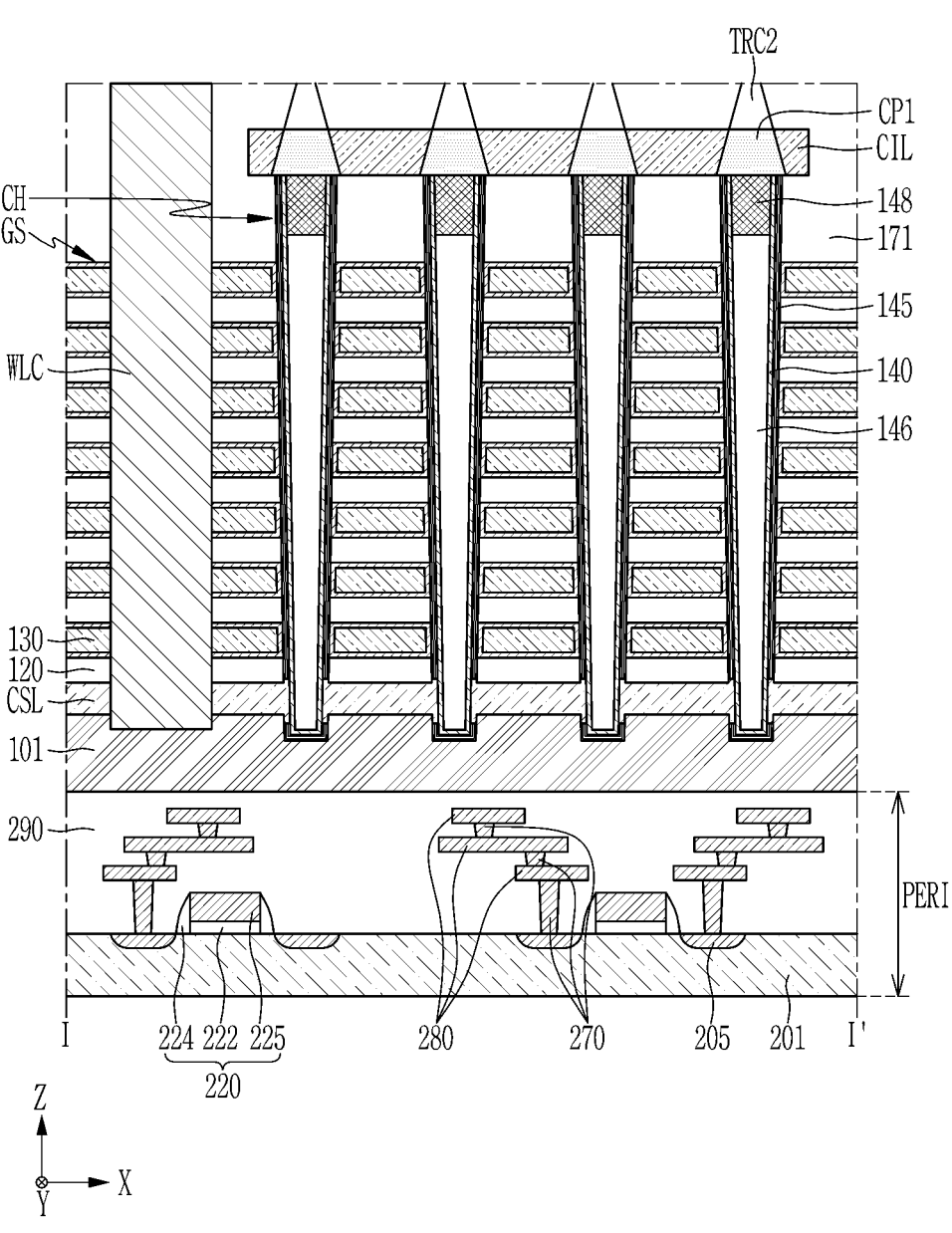
Figure 26:
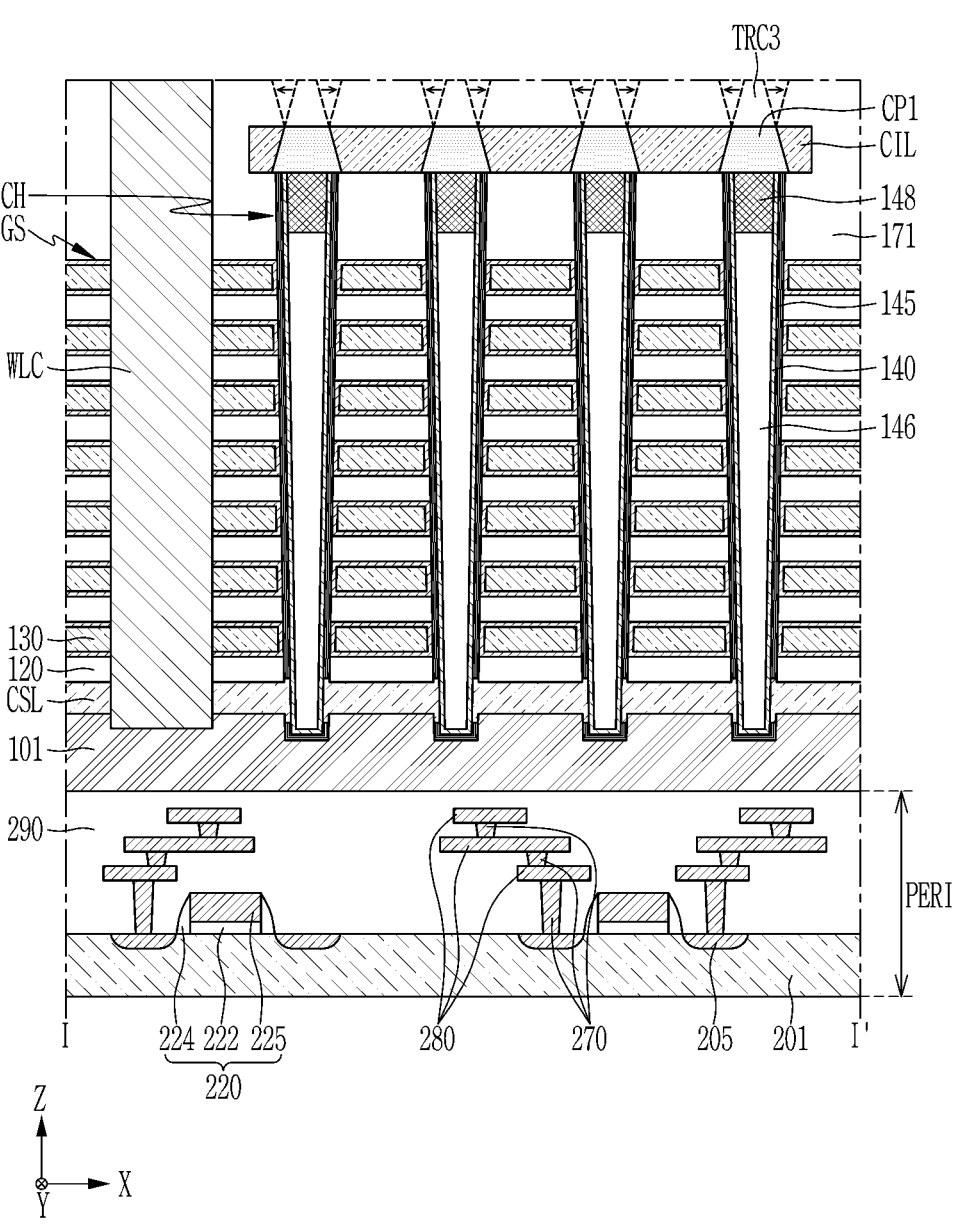
Figure 27:
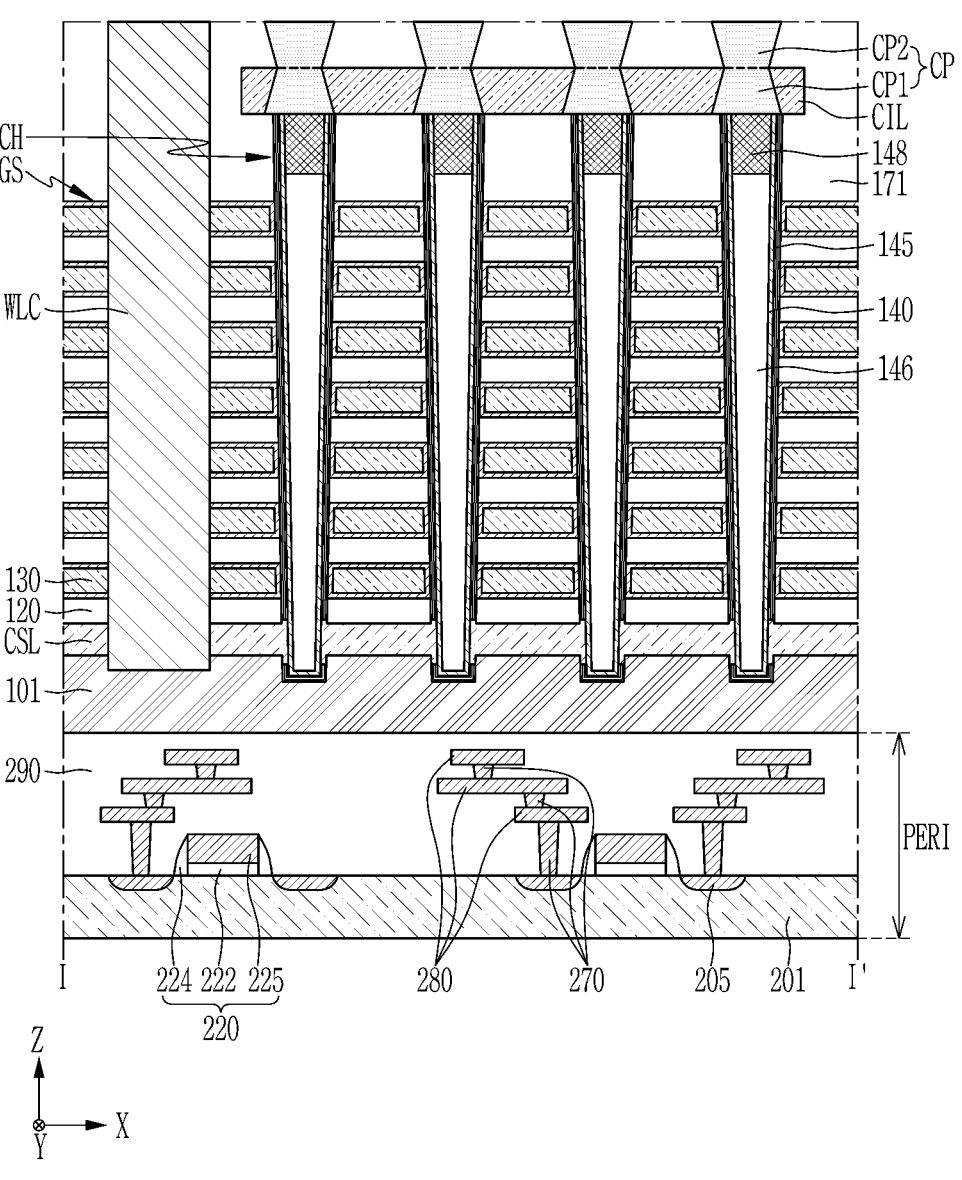

Subsequently, referring to FIG. 25 to FIG. 27, through the process steps as described above with reference to FIG. 19 to FIG. 21, a cross-sectional structure in which the side surfaces of the first portion CP1 and the second portion CP2 of the contact pads CP contact different insulating layers may be formed.

Specifically, the first portion CP1 of the contact pad CP may be formed by etching a portion of the contact pad material layer CPM from the upper surface thereof toward the lower surface thereof, and the second trench TRC2 extending in the third direction (Z direction) may be formed on the first portion CP1 of the contact pad CP. The second trench TRC2 may extend from the upper surface of the first upper insulating layer 171 to substantially the same line as the upper surface of the contact pad insulating layer CIL. However, the depth of the second trench TRC2 is not limited thereto, and may be variously changed.

Subsequently, a portion of the inner sidewall of the second trench TRC2 is etched to form the third trench TRC3, and then the second portion CP2 of the contact pad CP including the same material as the first portion CP1 of the first contact pad CP may be formed in the third trench TRC3.

Accordingly, the side surface of the first portion CP1 of the contact pads CP may contact the contact pad insulating layer CIL, and the side surface of the second portion CP2 of the contact pads CP may contact the first upper insulating layer 171.

Figure 28:
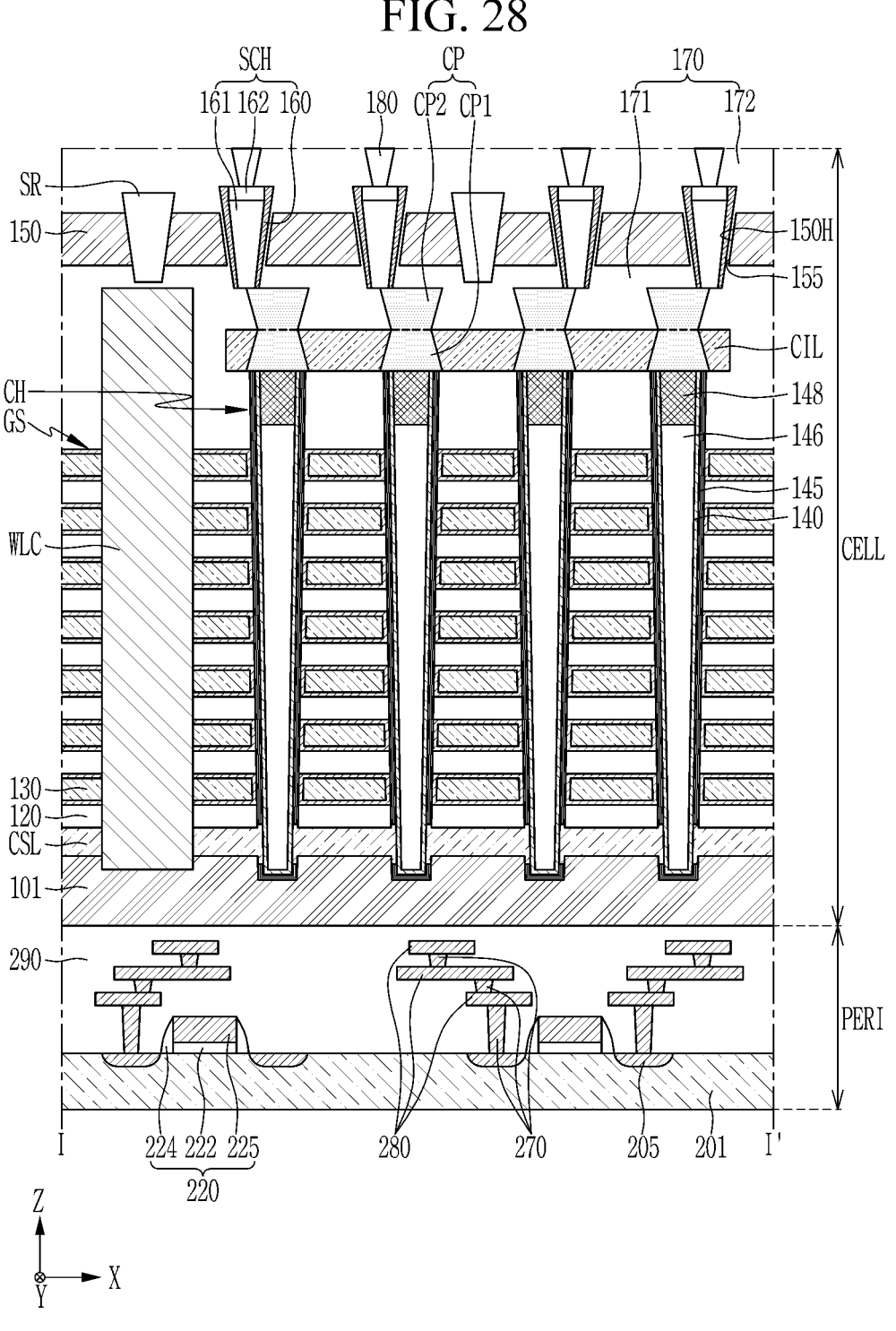

Subsequently, referring to FIG. 28, through the process step as described above with reference to FIG. 22, the second stacked structure that includes the string select channel structure SCH penetrating the string select gate layer 150 and that is staggered with the channel structures CH may be formed on the contact pads CP.

Figure 29:
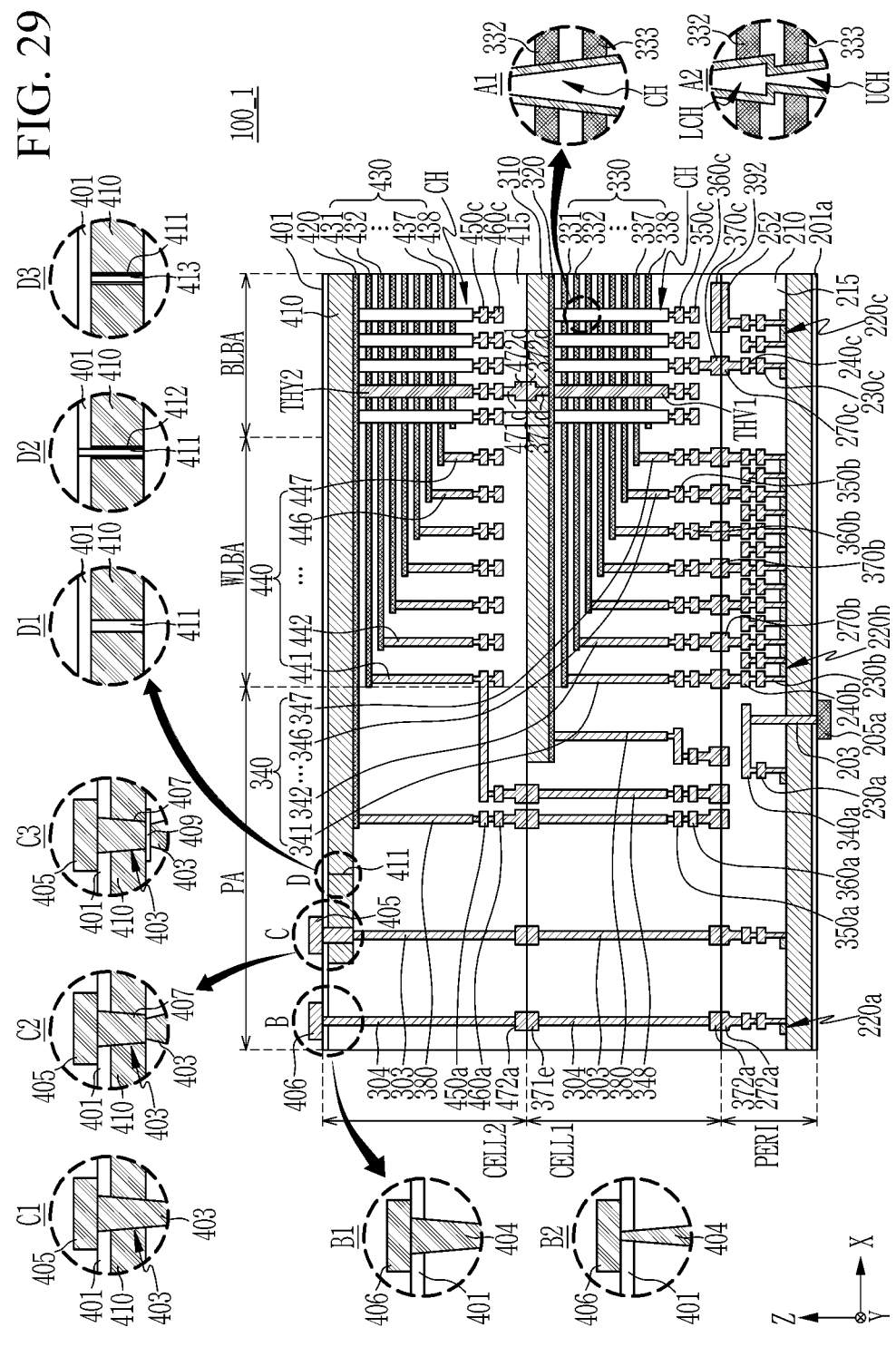
FIG. 29 illustrates a cross-sectional view of a semiconductor device according to an embodiment.

FIG. 29 illustrates a cross-sectional view for explaining a semiconductor device 100_1 according to an embodiment.

Referring to FIG. 29, the semiconductor device 100_1 may have a chip to chip (C2C) structure. Here, the C2C structure may mean that at least one upper chip including the cell area (CELL) and at least one lower chip including the peripheral circuit area (PERI) are respectively fabricated and then the at least one upper chip and the at least one lower chip are connected with each other by a bonding method. For example, the bonding method may refer to a method of electrically or physically connecting a bonding metal pattern formed on an uppermost metal layer of the upper chip and a bonding metal pattern formed on an uppermost metal layer of the lower chip to each other. For example, when the bonding metal patterns are formed of copper (Cu), the bonding method may be a Cu—Cu bonding method. In an embodiment, the bonding metal patterns may also be formed of aluminum (Al) or tungsten (W).

The semiconductor device 100_1 may include one or more upper chips including the cell area. For example, as shown in FIG. 29, the semiconductor device 100_1 may be implemented to include two upper chips. However, this is only an example, and the number of the upper chips is not limited thereto.

When the semiconductor device 100_1 is implemented to include two upper chips, after manufacturing a first upper chip including a first cell area CELL1, a second upper chip including a second cell area CELL2, and the lower chip including the peripheral circuit area PERI, respectively, the semiconductor device 100_1 may be manufactured by connecting the first upper chip, the second upper chip, and the lower chip to each other by using a bonding method.

The first upper chip may be reversed and connected to the lower chip by a bonding method, and the second upper chip may also be reversed and connected to the first upper chip by a bonding method. In the following description, upper and lower portions of the first and second upper chips are defined based on before the first upper chip and the second upper chip are reversed. That is, in FIG. 29, the upper portion of the lower chip means an upper portion defined based on the +Z-axis direction, and the upper portion of each of the first and second upper chips means an upper portion defined based on the −Z-axis direction. However, this is only an example, and only one of the first upper chip and the second upper chip may be reversed and connected by a bonding method.

The peripheral circuit area PERI and the first and second cell areas CELL1 and CELL2 of the semiconductor device 100_1 include an external pad bonding area PA, a word line bonding area WLBA, and a bit line bonding area BLBA, respectively.

The peripheral circuit area PERI may include a first substrate 210 and a plurality of circuit elements 220a, 220b, and 220c formed on the first substrate 210. An interlayer insulating layer 215 including one or more insulating layers may be provided on the plurality of circuit elements 220a, 220b, and 220c, and a plurality of metal wires connecting the plurality of circuit elements 220a, 220b, and 220c may be provided in the interlayer insulating layer 215. For example, the plurality of metal wires may include first metal wirings 230a, 230b, and 230c respectively connected to the plurality of circuit elements 220a, 220b, and 220c, and second metal wires 240a, 240b, and 240c formed on the first metal wires 230a, 230b, and 230c. The plurality of metal wires may include at least one of various conductive materials. For example, the first metal wires 230a, 230b, and 230c may include or may be formed of tungsten having a relatively high electrical specific resistance, and the second metal wires 240a, 240b, and 240c may include or may be formed of copper having a relatively low electrical specific resistance.

In FIG. 29, only the first metal wires 230a, 230b, and 230c and the second metal wires 240a, 240b, and 240c are shown and described, but are not limited thereto, and one or more additional metal wires may be further formed on the second metal wires 240a, 240b, and 240c. In this case, the second metal wires 240a, 240b, and 240c may include or may be formed of aluminum. At least some of the additional metal wires formed on the second metal wirings 240a, 240b, and 240c may include or may be formed of copper having lower electrical specific resistance than aluminum of the second metal wires 240a, 240b, and 240c.

The interlayer insulating layer 215 is disposed on the first substrate 210, and may include or may be formed of an insulating material such as a silicon oxide and a silicon nitride.

The first and second cell areas CELL1 and CELL2 may each include at least one memory block. The first cell area CELL1 may include a second substrate 310 and a common source line 320. On the second substrate 310, a plurality of word lines 331 to 338 and 330 may be stacked along the direction (Z-axis direction) perpendicular to the upper surface of the second substrate 310. String select lines and ground select lines may be disposed at upper and lower portions of the word lines 330, and a plurality of word lines 330 may be disposed between the string select lines and the ground select line. Similarly, the second cell area CELL2 includes a third substrate 410 and a common source line 420, and a plurality of word lines 431 to 438 and 430 may be stacked along the direction (Z-axis direction) perpendicular to an upper surface of the third substrate 410. The second substrate 310 and the third substrate 410 may include various materials, and for example, they may be silicon substrates, silicon-germanium substrates, germanium substrates, or substrates with a monocrystalline epitaxial layer grown on a monocrystalline silicon substrate. A plurality of channel structures CH may be formed in each of the first and second cell areas CELL1 and CELL2.

As shown in A1, the channel structure CH is provided in the bit line bonding area BLBA, and may extend in a direction perpendicular to the upper surface of the second substrate 310 to pass through the word lines 330, the string select lines, and the ground select line. The channel structure CH may include a data storage layer, a channel layer, and a filling insulating layer. The channel layer may be electrically connected to a first metal wire 350c and a second metal wire 360c in the bit line bonding area BLBA. For example, the second metal wire 360c may be a bit line, and may be connected to the channel structure CH through the first metal wire 350c. The bit line 360c may extend along the second direction (Y-axis direction) parallel to the upper surface of the second substrate 310.

In some embodiments, when the string select lines and the string select channel structure (see 'SCH' in FIG. 3) are disposed at the upper portion of the channel structures CH, that is, when the string select channel structure SCH passes through the string select line and is disposed above the first upper chip and/or the second upper chip, and the central axis of the string select channel structure SCH is staggered with the central axis of the channel structure CH in the −Z direction, as shown in FIG. 3, the channel structures CH may be connected to the string select channel structures SCH through the contact pads (see 'CP' in FIG. 3). For example, when viewed in a plan view, the central axis of the string select channel structure SCH may be spaced apart from the central axis of the channel structure CH in the X direction as shown in FIG. 2, and the contact pad CP may overlap each of the string select channel structure SCH and the channel structure CH.

As shown in A2, the channel structure CH may include a lower channel LCH and an upper channel UCH connected with each other. For example, the channel structure CH may be formed through a process for the lower channel LCH and a process for the upper channel UCH. The lower channel LCH may extend in a direction perpendicular to the upper surface of the second substrate 310 to pass through the common source line 320 and the lower word lines 331 and 332. The lower channel LCH may include a data storage layer, a channel layer, and a filling insulating layer, and may be connected to the upper channel UCH. The upper channel UCH may pass through the upper word lines 333 to 338. The upper channel UCH may include a data storage layer, a channel layer, and a filling insulating layer, and the channel layer of the upper channel UCH may be electrically connected to the first metal wire 350c and the second metal wire 360c. As the length of the channel increases, it may be difficult to form a channel having a constant width due to process reasons. The semiconductor device 100_1 according to the embodiment may include a channel having improved width uniformity through the lower channel LCH and the upper channel UCH formed through a sequential process.

As shown in A2, when the channel structure CH is formed to include the lower channel LCH and the upper channel UCH, a word line disposed near a boundary between the lower channel LCH and the upper channel UCH may be a dummy word line. For example, the word line 332 and the word line 333 forming a boundary between the lower channel LCH and the upper channel UCH may be dummy word lines. In this case, data may not be stored in memory cell transistors connected to the dummy word line.

The number of pages corresponding to the memory cell transistors connected to the dummy word line may be smaller than the number of pages corresponding to memory cell transistors connected to a general word line. A voltage level applied to the dummy word line may be different from that applied to the general word line, and thus, an effect of a non-uniform channel width between the lower channel LCH and the upper channel UCH on an operation of the memory device may be reduced.

Meanwhile, in A2, the number of the lower word lines 331 and 332 through which the lower channel LCH passes is shown to be smaller than the number of the upper word lines 333 to 338 through which the upper channel UCH passes. However, this is only an example, and is not limited thereto. In an embodiment, the number of the lower word lines passing through the lower channel LCH may be substantially the same as or larger than the number of the upper word lines passing through the upper channel UCH.

The structure and connection relationship of the channel structure CH disposed in the first cell area CELL1 as described above may be equally applied to the channel structure CH disposed in the second cell area CELL2.

In the bit line bonding area BLBA, a first through electrode THV1 may be provided in the first cell area CELL1, and a second through electrode THV2 may be provided in the second cell area CELL2. As shown in FIG. 29, the first through electrode THV1 may pass through the common source line 320 and the plurality of word lines 330. However, this is only an example, and the first through electrode THV1 may further pass through the second substrate 310. The first through electrode THV1 may include or may be formed of a conductive material. Alternatively, the first through electrode THV1 may include or may be formed of a conductive material surrounded by an insulating material. The second through electrode THV2 may also be provided in substantially the same shape and structure as the first through electrode THV1.

The first through electrode THV1 and the second through electrode THV2 may be electrically connected with each other through a first through metal pattern 372d and a second through metal pattern 472d. The first through metal pattern 372d may be formed at the lower portion of the first upper chip including the first cell area CELL1, and the second through metal pattern 472d may be formed at the upper portion of the second upper chip including the second cell area CELL2. The first through electrode THV1 may be electrically connected to the first metal wire 350c and the second metal wire 360c. A lower via 371d may be formed between the first through electrode THV1 and the first through metal pattern 372d, and an upper via 471d may be formed between the second through electrode THV2 and the second through metal pattern 472d. The first through metal pattern 372d and the second through metal pattern 472d may be connected by a bonding method.

In the bit line bonding area BLBA, an upper metal pattern 252 may be formed on the uppermost metal layer of the peripheral circuit area PERI, and an upper metal pattern 392 having substantially the same shape as the upper metal pattern 252 may be formed on the uppermost metal layer of the first cell area CELL1. The upper metal pattern 392 of the first cell area CELL1 and the upper metal pattern 252 of the peripheral circuit area PERI may be electrically connected with each other by a bonding method. In the bit line bonding area BLBA, the bit line 360c may be electrically connected to a page buffer that is included in the peripheral circuit area PERI. For example, some of the circuit elements 220c of the peripheral circuit area PERI may provide a page buffer, and the bit line 360c may be electrically connected to the circuit elements 220c providing the page buffer through the upper bonding metal 370c of the first cell area CELL1 and the upper bonding metal 270c of the peripheral circuit area PERI.

Next, referring to FIG. 29, in the word line bonding area WLBA, the word lines 330 of the first cell area CELL1 may extend in the first direction (X-axis direction) parallel to the upper surface of the second substrate 310, and may be connected to the plurality of cell contact plugs 341 to 347 and 340. The first metal wire 350b and the second metal wire 360b may be sequentially connected to the upper portions of the cell contact plugs 340 connected to the word lines 330. The cell contact plugs 340 may be connected to the peripheral circuit area PERI through the upper bonding metal 370b of the first cell area CELL1 and the upper bonding metal 270b of the peripheral circuit area PERI In the word line bonding area WLBA.

The cell contact plugs 340 may be electrically connected to a row decoder included in the peripheral circuit area PERI. For example, some of the circuit elements 220b of the peripheral circuit area PERI provide a row decoder, and the cell contact plugs 340 may be electrically connected to the circuit elements 220b providing the row decoder through the upper bonding metal 370b of the first cell area CELL1 and the upper bonding metal 270b of the peripheral circuit area PERI. An operating voltage of the circuit elements 220b of the row decoder may be different from that of the circuit elements 220c of the page buffer. For example, the operating voltage of the circuit elements 220c providing the page buffer may be higher than that of the circuit elements 220b providing the row decoder.

Similarly, in the word line bonding area WLBA, the word lines 430 of the second cell area CELL2 may extend in the first direction (X-axis direction) parallel to the upper surface of the third substrate 410, and may be connected to the plurality of cell contact plugs 441 to 447 and 440. The cell contact plugs 440 may be connected to the peripheral circuit area PERI through the upper metal pattern of the second cell area CELL2, the lower metal pattern and the upper metal pattern of the first cell area CELL1, and the cell contact plug 348.

In the word line bonding area WLBA, the upper bonding metal 370b may be formed in the first cell area CELL1, and the upper bonding metal 270b may be formed in the peripheral circuit area PERI. The upper bonding metal 370b of the first cell area CELL1 and the upper bonding metal 270b of the peripheral circuit area PERI may be electrically connected with each other by a bonding method. The upper bonding metal 370b and the upper bonding metal 270b may include or may be formed of aluminum, copper, or tungsten.

In the external pad bonding area PA, the lower metal pattern 371e may be formed below the first cell area CELL1, and the upper metal pattern 472a may be formed on the second cell area CELL2. The lower metal pattern 371e of the first cell area CELL1 and the upper metal pattern 472a of the second cell area CELL2 may be connected by a bonding method in the external pad bonding area PA. Similarly, the upper metal pattern 372a may be formed on the first cell area CELL1, and the upper metal pattern 272a may be formed on the peripheral circuit area PERI. The upper metal pattern 372a of the first cell area CELL1 and the upper metal pattern 272a of the peripheral circuit area PERI may be connected by a bonding method.

Common source line contact plugs 380 and 480 may be disposed in the external pad bonding area PA. The common source line contact plugs 380 and 480 may include or may be formed of a conductive material such as a metal, a metal compound, and a doped polysilicon. The common source line contact plug 380 of the first cell area CELL1 may be electrically connected to the common source line 320, and the common source line contact plug 480 of the second cell area CELL2 may be electrically connected to the common source line 420. A first metal wire 350a and a second metal wire 360a may be sequentially stacked on the common source line contact plug 380 of the first cell area CELL1, and a first metal wire 450a and a second metal wire 460a may be sequentially stacked on the common source line contact plug 480 of the second cell area CELL2.

Input and output pads 205a, 405, and 406 may be disposed in the external pad bonding area PA. Referring to FIG. 29, a lower insulating film 201a may cover the lower surface of the first substrate 210, and a first input/output pad 205a may be formed on the lower insulating film 201a. The first input/output pad 205a may be connected to at least one of a plurality of circuit elements 220a disposed in the peripheral circuit area PERI through the first input/output contact plug 203, and may be separated from the first substrate 210 by the lower insulating film 201a. A side insulating film may be disposed in a space between the first input/output contact plug 203 and the first substrate 210 to electrically separate the first input/output contact plug 203 and the first substrate 210.

An upper insulating film 401 covering the upper surface of the third substrate 410 may be formed on the third substrate 410. The second input/output pad 405 and/or the third input/output pad 406 may be disposed on the upper insulating film 401. The second input/output pad 405 may be connected to at least one of the plurality of circuit elements 220a disposed in the peripheral circuit area PERI through the second input/output contact plugs 403 and 303, and the third input/output pad 406 may be connected to at least one of the plurality of circuit elements 220a disposed in the peripheral circuit area PERI through the third input/output contact plugs 404 and 304.

The third substrate 410 may not be disposed in an area in which the input/output contact plugs are disposed. For example, as shown in B, the third input/output contact plug 404 may be separated from the third substrate 410 in a direction parallel to the upper surface of the third substrate 410, and may pass through the interlayer insulating layer 415 of the second cell area CELL2 to be connected to the third input/output pad 406. In this case, the third input/output contact plug 404 may be formed through various processes.

For example, as shown in B1, the third input/output contact plug 404 may extend in the third direction (Z-axis direction), and may be formed such that its diameter increases toward the upper insulating film 401. That is, while the diameter of the channel structure CH described in A1 decreases toward the upper insulating film 401, the diameter of the third input/output contact plug 404 may increase toward the upper insulating film 401. For example, the third input/output contact plug 404 may be formed after the second cell area CELL2 and the first cell area CELL1 are connected by a bonding method.

As shown in B2, the third input/output contact plug 404 may extend in the third direction (Z-axis direction), and may be formed such that its diameter decreases toward the upper insulating film 401. That is, the diameter of the third input/output contact plug 404 may be formed to decrease toward the upper insulating film 401 like the channel structure CH. For example, the third input/output contact plug 404 may be formed together with the cell contact plugs 440 before the second cell area CELL2 and the first cell area CELL1 are bonded together.

In some embodiments, the input/output contact plugs may overlap the third substrate 410. For example, as shown in C, the second input/output contact plug 403 is formed by penetrating the interlayer insulating layer 415 of the second cell area CELL2 in the third direction (Z-axis direction), and may be electrically connected to the input/output pad 405 through the third substrate 410. In this case, the connection structure of the second input/output contact plug 403 and the second input/output pad 405 may be implemented in various ways.

For example, as shown in C1, an opening 408 penetrating the third substrate 410 may be formed, and the second input/output contact plug 403 may be directly connected to the second input/output pad 405 through the opening 408 formed in the third substrate 410. In this case, as shown in C1, the diameter of the second input/output contact plug 403 may increase toward the second input/output pad 405. However, this is only an example, and the diameter of the second input/output contact plug 403 may decrease toward the second input/output pad 405.

For example, as shown in C2, an opening 408 penetrating the third substrate 410 may be formed, and a contact 407 may be formed within the opening 408. One end of the contact 407 may be connected to the second input/output pad 405, and the other end thereof may be connected to the second input/output contact plug 403. Accordingly, the second input/output contact plug 403 may be electrically connected to the second input/output pad 405 through the contact 407 in the opening 408. In this case, as shown in C2, the diameter of the contact 407 may increase toward the second input/output pad 405, and the diameter of the second input/output contact plug 403 may decrease toward the second input/output pad 405. For example, the third input/output contact plug 403 may be formed together with the cell contact plugs 440 before the second cell area CELL2 and the first cell area CELL1 are bonded together, and the contact 407 may be formed after before the second cell area CELL2 and the first cell area CELL1 are bonded together.

As shown in C3, a stopper 409 may be further formed on the upper surface of the opening 408 of the third substrate 410 compared to C2. The stopper 409 may be a metal wire formed on substantially the same layer as the common source line 420. However, this is only an example, and the stopper 409 may be a metal wire formed on substantially same layer as at least one of the word lines 430. The second input/output contact plug 403 may be electrically connected to the second input/output pad 405 through the contact 407 and the stopper 409.

Meanwhile, similar to the second and third input/output contact plugs 403 and 404 of the second cell area CELL2, the diameters of the second and third input/output contact plugs 303 and 304 of the first cell area CELL1 may respectively decrease toward the lower metal pattern 371e, or may respectively increase toward the lower metal pattern 371e.

Meanwhile, in some embodiments, a slit 411 may be formed in the third substrate 410. For example, the slit 411 may be formed at an arbitrary position of the external pad bonding area PA. For example, as shown in D, the slit 411 may be disposed between the second input/output pad 405 and the cell contact plugs 440 when viewed in a plan view. However, this is only an example, and the slit 411 may be formed so that the second input/output pad 405 is disposed between the slit 411 and the cell contact plugs 440 when viewed in a plan view.

Illustratively, as shown in D1, the slit 411 may be formed to pass through the third substrate 410. The slit 411, for example, may be used to prevent the third substrate 410 from being finely cracked when forming the opening 408. However, this is only an example, and the slit 411 may be formed with a depth of about 60% to 70% of the thickness of the third substrate 410.

As shown in D2, a conductive material 412 may be formed in the slit 411. The conductive material 412, for example, may be used for discharging a leakage current generated during driving of the circuit elements in the external pad bonding area PA to the outside. In this case, the conductive material 412 may be connected to an external ground line.

As shown in D3, an insulating material 413 may be formed in the slit 411. The insulating material 413, for example, may be formed to electrically separate the second input/output pad 405 and the second input/output contact plug 403 disposed in the external pad bonding area PA from the word line bonding area WLBA. By forming the insulating material 413 in the slit 411, it is possible to block the voltage provided through the second input/output pad 405 from affecting the metal layer disposed on the third substrate 410 in the word line bonding area WLBA.

Meanwhile, in some embodiments, the first to third input/output pads 205a, 405, and 406 may be selectively formed. For example, the semiconductor device 100_1 may be implemented to include only the first input/output pad 205a disposed on the base substrate 201, or only the second input/output pad 405 disposed on the third substrate 410, or only the third input/output pad 406 disposed on the upper insulating film 401.

Meanwhile, in some embodiments, at least one of the second substrate 310 of the first cell area CELL1 and the third substrate 410 of the second cell area CELL2 may be used as a sacrificial substrate, and may be completely or partially removed before or after the bonding process. An additional film may be deposited after the substrate is removed. For example, the second substrate 310 of the first cell area CELL1 may be removed before or after bonding of the peripheral circuit area PERI and the first cell area CELL1, and an insulating film covering the upper surface of the common source line 320 or a conductive film for connection may be formed. Similarly, the third substrate 410 of the second cell area CELL2 may be removed before or after bonding of the first cell area CELL1 and the second cell area CELL2, and the upper insulating film 401 covering the upper surface of the common source line 420 or a conductive film for connection may be formed.

Figure 30:
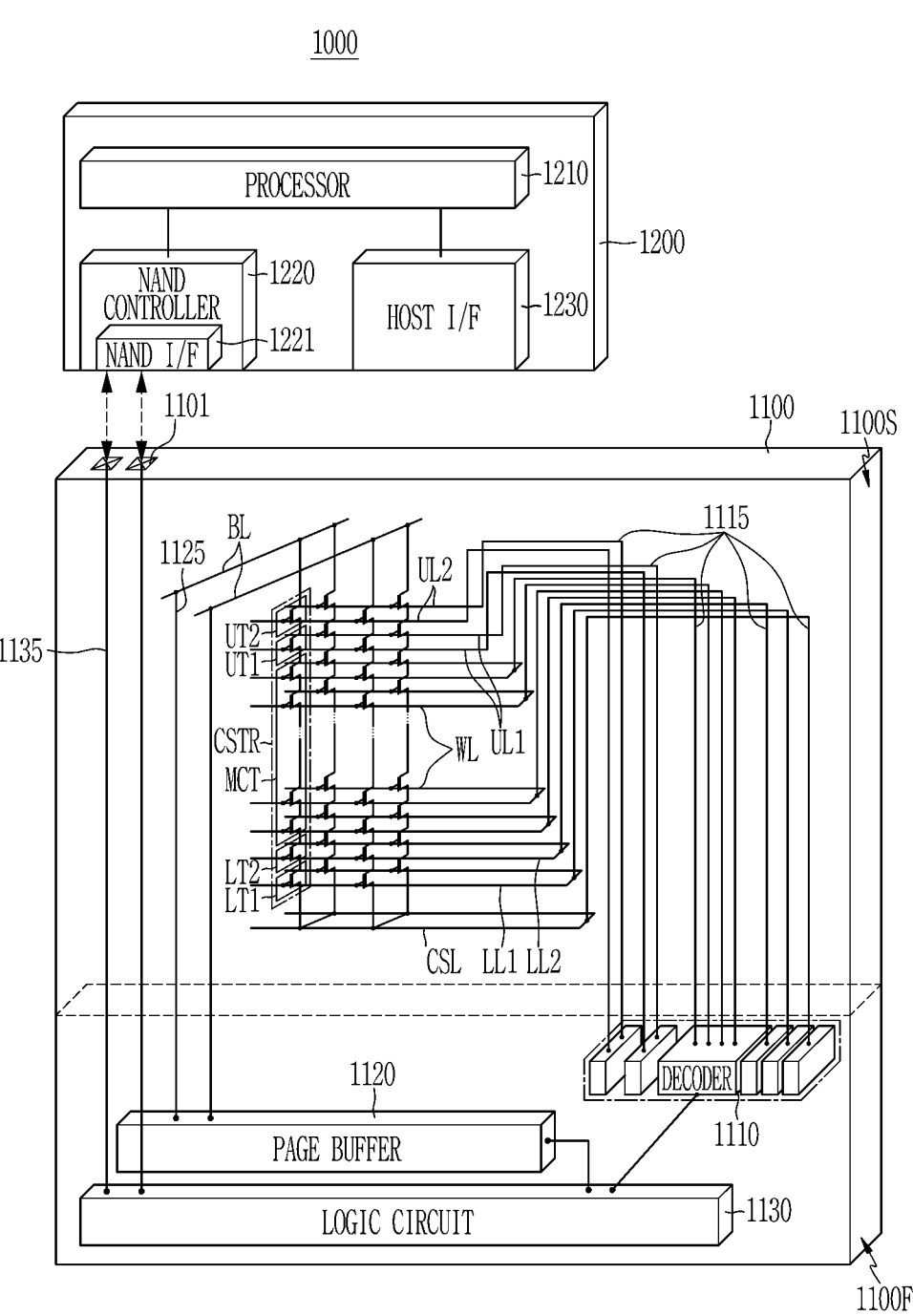
FIG. 30 illustrates a block diagram for explaining an electronic system according to some embodiments.
Figure 31:
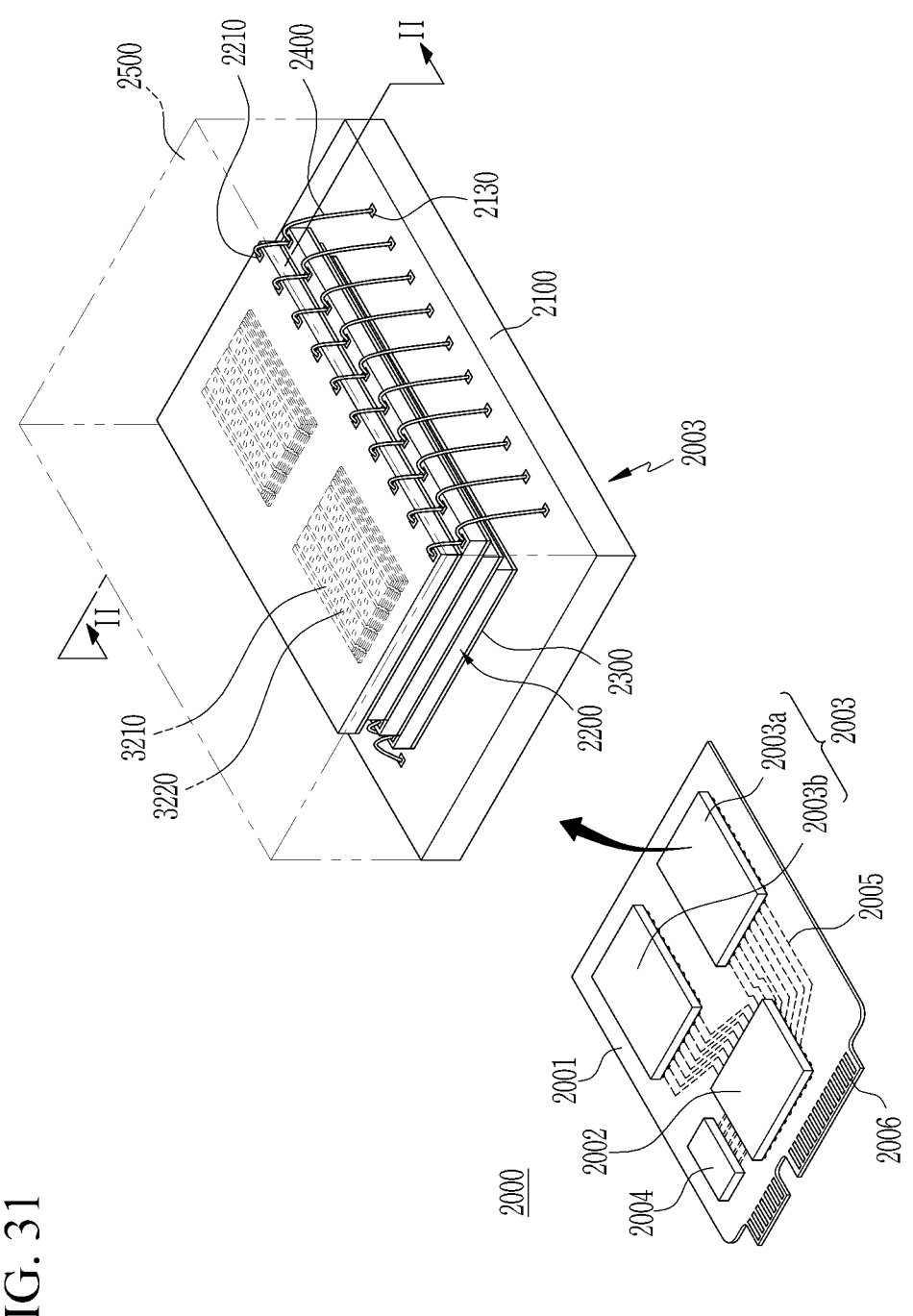
FIG. 31 illustrates a perspective view for explaining an electronic system according to some embodiments.
Figure 32:
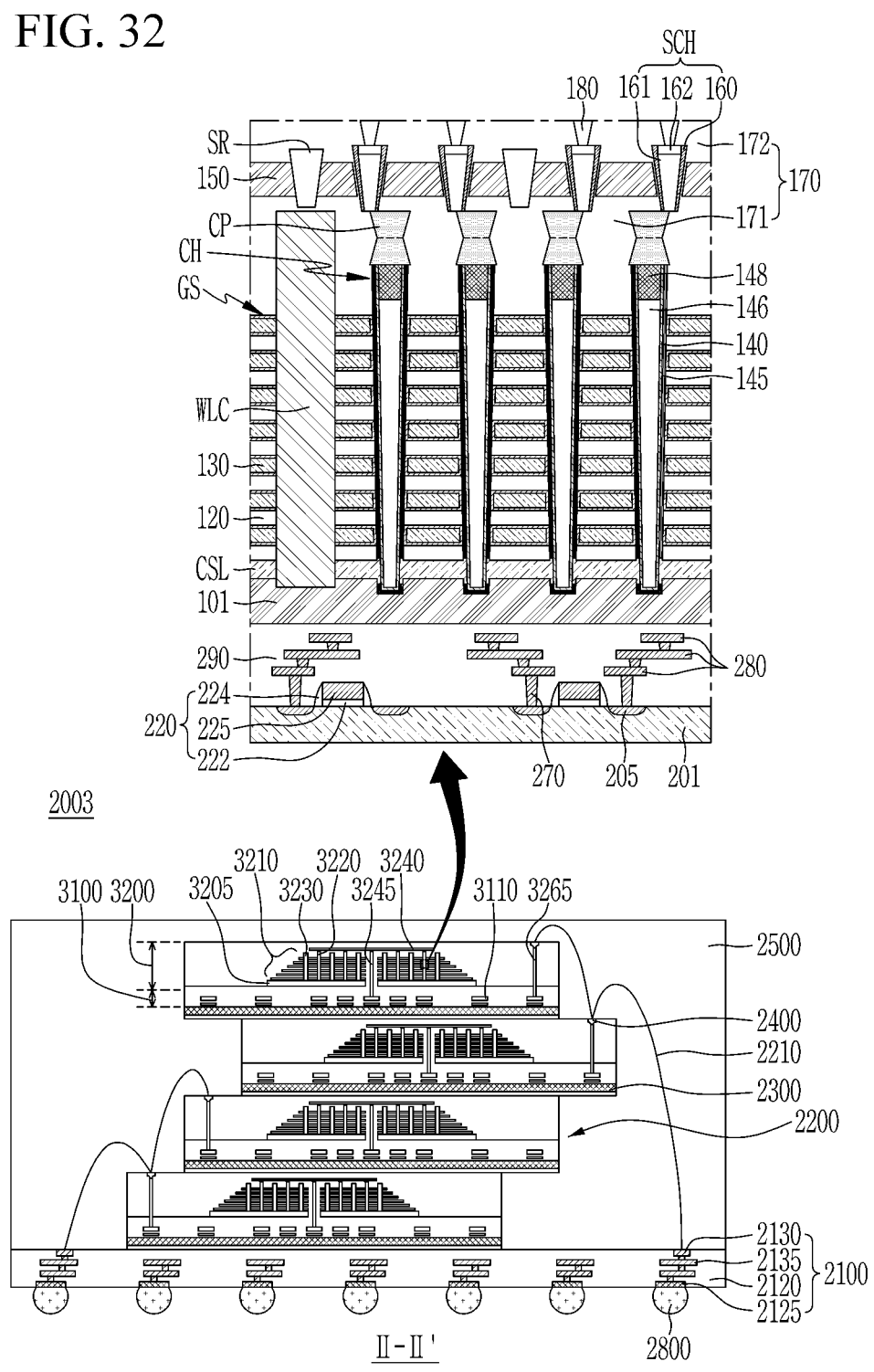
FIG. 32 and FIG. 33 illustrate cross-sectional views taken along line II-II' of FIG. 31.
Figure 33:
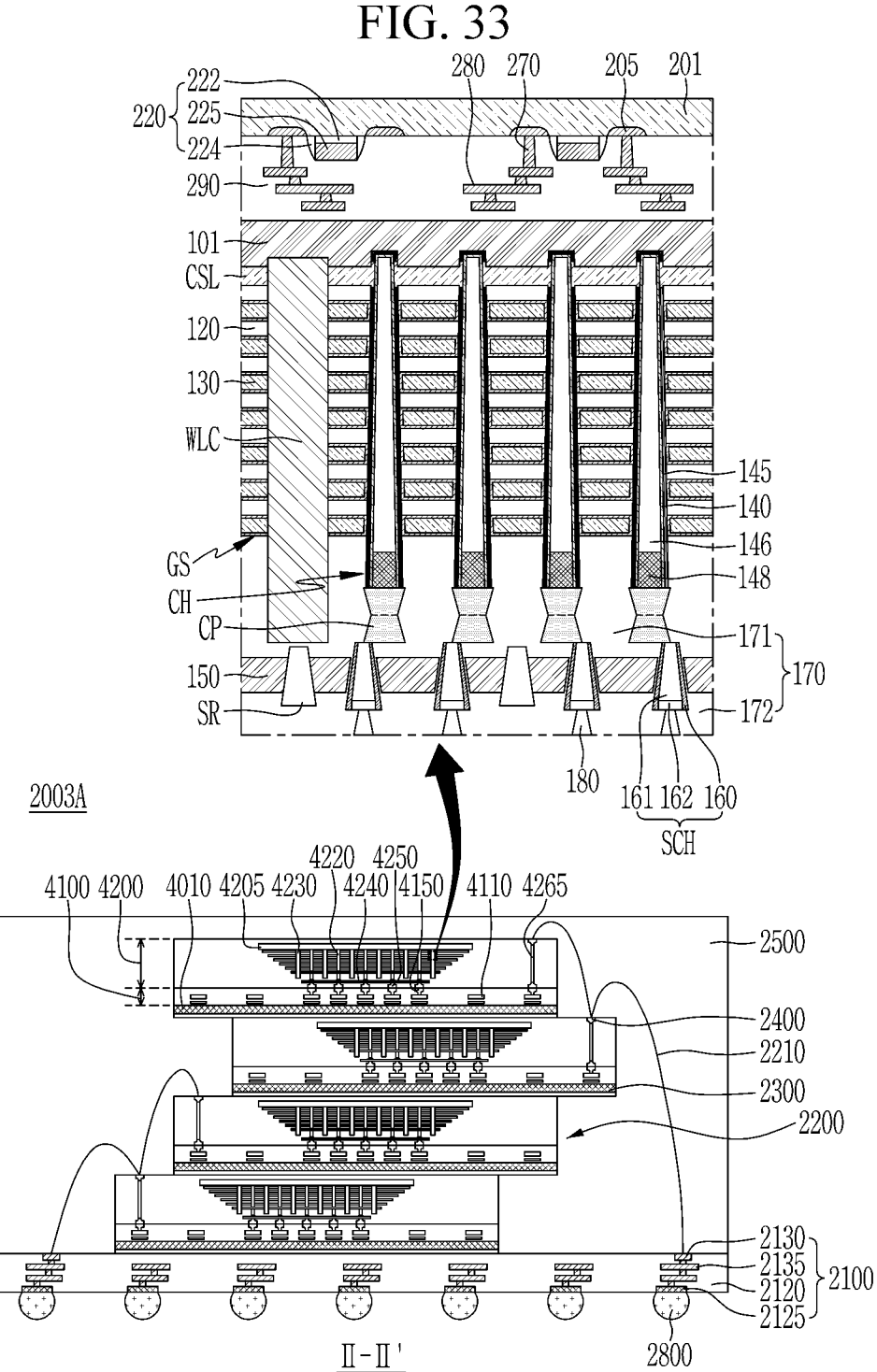

FIG. 30 illustrates a block diagram for explaining an electronic system according to some embodiments. FIG. 31 illustrates a perspective view for explaining an electronic system according to some embodiments. FIG. 32 and FIG. 33 illustrate cross-sectional views taken along line II-II' of FIG. 31.

Referring to FIG. 30, an electronic system 1000 according to some embodiments may include a semiconductor device 1100 and a controller 1200 electrically connected to the semiconductor device 1100. The electronic system 1000 may be a storage device including one or a plurality of semiconductor devices 1100 or an electronic device including the storage device. For example, the electronic system 1000 may be a solid state drive device (SSD), a universal serial bus (USB), a computing system, a medical device, or a communication device, including one or a plurality of semiconductor devices 1100.

The semiconductor device 1100 may be a non-volatile memory device (for example, a NAND flash memory device), and for example, may be the semiconductor device as described above with reference to FIG. 1 to FIG. 12. The semiconductor device 1100 may include a first structure 1100F and a second structure 1100S on the first structure 1100F. In some embodiments, the first structure 1100F may be disposed next to second structure 1100S.

The first structure 1100F may be a peripheral circuit structure including a decoder circuit 1110, a page buffer 1120, and a logic circuit 1130.

The second structure 1100S may be a memory cell structure including a bit line BL, a common source line CSL, word lines WL, first and second gate upper lines UL1 and UL2, first and second gate lower lines LL1 and LL2; and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed according to embodiments.

In some embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 through first connection wires 1115 extending from the first structure 1100F to the second structure 1100S. The bit lines BL may be electrically connected to the page buffer 1120 through second connection wires 1125 extending from the first structure 1100F to the second structure 1100S.

In the first structure 1100F, the decoder circuit 1110 and the page buffer 1120 may execute a control operation on at least one of the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wire 1135 extending from the first structure 1100F to the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may operate according to predetermined firmware, and may access the semiconductor device 1100 by controlling the NAND controller 1220. The NAND controller 1220 may include a NAND interface 1221 that processes communication with the semiconductor device 1100. Through the NAND interface 1221, a control instruction for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the electronic system 1000 and an external host. When a control instruction is received from an external host through the host interface 1230, the processor 1210 may control the semiconductor device 1100 in response to the control instruction.

Referring to FIG. 31, an electronic system 2000 according to some embodiments may include a main substrate 2001, a main controller 2002 mounted on the main substrate 2001, one or more semiconductor packages 2003, and a DRAM 2004. The semiconductor package 2003 and the DRAM 2004 may be connected to the main controller 2002 by wire patterns 2005 formed on the main substrate 2001.

The main substrate 2001 may include a connector 2006 including a plurality of pins coupled to an external host. The number and disposition of the plurality of pins in the connector 2006 may vary depending on a communication interface between the electronic system 2000 and the external host.

In some embodiments, the electronic system 2000 may communicate with the external host according to one of interfaces such as universal serial bus (USB), peripheral component interconnect express (PCI-Express), serial advanced technology attachment (SATA), and M-Phy for universal flash storage (UFS).

In some embodiments, the electronic system 2000 may operate with power supplied from an external host through connector 2006. The electronic system 2000 may further include a power management integrated circuit (PMIC) that distributes the power supplied from the external host to the main controller 2002 and the semiconductor package 2003.

The main controller 2002 may write data to the semiconductor package 2003 or read data from the semiconductor package 2003, and may improve an operation speed of the electronic system 2000.

The DRAM 2004 may be a buffer memory for reducing a speed difference between the semiconductor package 2003, which is a data storage space, and an external host. The DRAM 2004 included in the electronic system 2000 may also operate as a kind of cache memory, and may provide a space for temporarily storing data in a control operation for the semiconductor package 2003. When the electronic system 2000 includes the DRAM 2004, the main controller 2002 may further include a DRAM controller for controlling the DRAM 2004 in addition to the NAND controller for controlling the semiconductor package 2003.

The semiconductor package 2003 may include a first semiconductor package 2003a and a second semiconductor package 2003b spaced apart from each other. The first semiconductor package 2003a and the second semiconductor package 2003b may each be a semiconductor package including a plurality of semiconductor chips 2200. The first semiconductor package 2003a and the second semiconductor package 2003b may each include a package substrate 2100, semiconductor chips 2200 on the package substrate 2100, adhesive layers 2300 respectively disposed on lower surfaces of the semiconductor chips 2200, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 30.

Each of the semiconductor chips 2200 may include a stacked structure 3210 and channel structures 3220. Each of the semiconductor chips 2200 may include the semiconductor device as described above with reference to FIG. 1 to FIG. 12.

In some embodiments, the connection structure 2400 may be a bonding wire electrically connecting the input/output pads 2210 and the package upper pads 2130. Accordingly, in each of the first semiconductor package 2003a and the second semiconductor package 2003b, the semiconductor chips 2200 may be electrically connected with each other by using a bonding wire method, and may be electrically connected to the package upper pads 2130 of the package substrate 2100.

In some embodiments, in each of the first semiconductor package 2003a and the second semiconductor package 2003b, the semiconductor chips 2200 may be electrically connected with each other by a connection structure including a through silicon via (TSV) instead of the bonding wire type of connection structure 2400.

In some embodiments, the main controller 2002 and the semiconductor chips 2200 may be included in one package. In some embodiments, the main controller 2002 and the semiconductor chips 2200 may be mounted on a separate interposer substrate different from the main substrate 2001, and the main controller 2002 and the semiconductor chips 2200 may be connected with each other by a wire formed on the interposer substrate.

FIG. 32 and FIG. 33 each illustrate an embodiment of the semiconductor package 2003 of FIG. 31, and each conceptually illustrates an area taken along line II-II' of the semiconductor package 2003 of FIG. 31.

Referring to FIG. 32, in some embodiments, in the semiconductor package 2003, the package substrate 2100 may be a printed circuit board. The package substrate 2100 may include a package substrate body portion 2120, package upper pads 2130 disposed on an upper surface of the package substrate body portion 2120, lower pads 2125 disposed on or exposed through a lower surface of the package substrate body portion 2120, and inner wires 2135 electrically connecting the upper pads 2130 and the lower pads 2125 inside the package substrate body portion 2120. The upper pads 2130 may be electrically connected to the connection structures 2400. The lower pads 2125 may be connected to the wire patterns 2005 of a main substrate 2010 of the electronic system 2000 through conductive connection portions 2800 as shown in FIG. 31.

Each of the semiconductor chips 2200 may include a semiconductor substrate 3010, and a first structure 3100 and a second structure 3200 sequentially stacked on the semiconductor substrate 3010.

The first structure 3100 may include a peripheral circuit area including peripheral wires 3110.

The second structure 3200 may include a common source line 3205, a stacked structure 3210 on the common source line 3205, channel structures 3220 and word line cuts 3230 penetrating the stacked structure 3210, bit lines 3240 electrically connected to the channel structures 3220, and gate connection wires (see '1115' in FIG. 30) electrically connected to word lines (see 'WL' in FIG. 30) of the stacked structure 3210.

In an electronic system according to some embodiments, each of the semiconductor chips 2200 may include the semiconductor device as described above with reference to FIG. 1 to FIG. 12. For example, the first structure 3100 may include the peripheral circuit area PERI described above with reference to FIG. 3.

The second structure 3200 may include the cell area CELL as described above with reference to FIG. 2 to FIG. 12. For example, the cell area CELL may include the substrate 101, the stacked structure GS, the channel structure CH, the string select gate layer 150 disposed on the channel structure CH, the string select channel structure SCH penetrating the string select gate layer 150, and the contact pad CP connecting the channel structure CH and the string select channel structure SCH.

Each of the semiconductor chips 2200 may include a through wire 3245 electrically connected to the peripheral wires 3110 of the first structure 3100 and extending into the second structure 3200. The through wire 3245 may pass through the gate stacked structure 3210, and may be further disposed outside the gate stacking structure 3210. Each of the semiconductor chips 2200 may further include an input/output connection wire 3265 electrically connected to the peripheral wires 3110 of the first structure 3100 and extending into the second structure 3200, and an input/output pad (see '2210' in FIG. 31) electrically connected to the input/output connection wire 3265.

Referring to FIG. 33, in a semiconductor package 2003A, each of semiconductor chips 2200*a* may include a semiconductor substrate 4010, a first structure 4100 on the semiconductor substrate 4010, and a second structure 4200 bonded to the first structure 4100 by a wafer bonding method on the first structure 4100.

The first structure 4100 may include a peripheral circuit area including a peripheral wire 4110 and first bonding structures 4150.

The second structure 4200 may include a common source line 4205, a stacked structure 4210 between the common source line 4205 and the first structure 4100, channel structures 4220 and word line cuts 4230 penetrating the stacked structure 4210, and second bonding structures 4250 respectively electrically connected to the channel structures 4220 and the word lines of the stacked structure 4210 (see 'WL' in FIG. 30). For example, each of the second bonding structures 4250 may be electrically connected to the channel structures 4220 and the word lines (see 'WL' in FIG. 30), through bit lines 4240 electrically connected to the channel structures 4220 and gate connection wires (see '1115' in FIG. 30) electrically connected to the word lines (see 'WL' in FIG. 30). The first bonding structures 4150 of the first structure 4100 and the second bonding structures 4250 of the second structure 4200 may be bonded while contacting each other. Bonded portions of the first bonding structures 4150 and the second bonding structures 4250 may include or may be formed of, for example, copper (Cu).

In the semiconductor package 2003A according to some embodiments, each of the semiconductor chips 2200*a* may include the semiconductor device as described above with reference to FIG. 1 to FIG. 12. For example, the first structure 4100 may include the peripheral circuit area PERI as described above with reference to FIG. 3.

The second structure 4200 may include the cell area CELL as described above with reference to FIG. 2 to FIG. 12. For example, the cell area CELL may include the substrate 101, the stacked structure GS, the channel structure CH, the string select gate layer 150 disposed on the channel structure CH, the string select channel structure SCH penetrating the string select gate layer 150, and the contact pad CP connecting the channel structure CH and the string select channel structure SCH.

In some embodiments, each of the semiconductor chips 2200*a* may further include an input/output pad 2210 and an input/output connection wire 4265 under the input/output pad 2210. The input/output connection wire 4265 may be electrically connected to some of the second bonding structures 4210.

The semiconductor chips 2200 of FIG. 32 and the semiconductor chips 2200*a* of FIG. 33 may be electrically connected with each other by the connection structures 2400 having the form of bonding wires. However, in some embodiments, the semiconductor chips in one semiconductor package, such as the semiconductor chips 2200 in FIG. 3 and the semiconductor chips 2200*a* in FIG. 4, may be electrically connected with each other by a connection structure including a through silicon via (TSV).

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A semiconductor device comprising:

a plurality of gate layers and a plurality of lower insulating layers that are alternately stacked on an upper surface of a substrate in a vertical direction that is perpendicular to the upper surface of the substrate;

a channel structure passing through the plurality of gate layers and the plurality of lower insulating layers and extending in the vertical direction;

a string select gate layer disposed on the channel structure;

a string select channel structure passing through the string select gate layer and extending in the vertical direction;

a contact pad disposed in a space between the channel structure and the string select channel structure and connecting the channel structure to the string select channel structure, wherein the string select channel structure, the contact pad, and the channel structure are arranged in the vertical direction, wherein a lower surface of the contact pad contacts the channel structure and an upper surface of the contact pad contacts the string select channel structure, wherein a first width of the lower surface of the contact pad is greater than a second width of a central portion of the contact pad, and wherein a third width of the upper surface of the contact pad is greater than the second width of the central portion of the contact pad; and an upper insulating layer disposed between an uppermost gate layer of the plurality of gate layers and the string select gate layer, wherein the contact pad includes:

a first portion contacting the channel structure; and a second portion contacting the string select channel structure and disposed on the first portion, wherein a first side surface of the first portion has a positive slope, and a second side surface of the second portion has a negative slope, wherein the first side surface is connected to the second side surface, wherein an upper surface of the upper insulating layer is disposed higher than the upper surface of the contact pad, wherein the upper insulating layer includes:

a first insulating layer contacting the first side surface of the first portion; and a second insulating layer contacting the second side surface of the second portion, and wherein the first insulating layer and the second insulating layer include different materials.

2. The semiconductor device of claim 1, wherein the first portion and the second portion are symmetric with respect to a boundary between the first portion and the second portion, and wherein the contact pad has the second width at the boundary between the first portion and the second portion.

3. The semiconductor device of claim 1, wherein a width of a lower surface of the first portion corresponds to the first width and a width of an upper surface of the second portion corresponds to the third width, wherein the first width is substantially the same as the third width, and wherein a height of the first portion and a height of the second portion are different.

4. The semiconductor device of claim 1, wherein a width of a lower surface of the first portion corresponds to the first width and a width of an upper surface of the second portion corresponds to the third width, wherein the first width is different from the third width, and wherein a width of an upper surface of the first portion is different from a width of a lower surface of the second portion.

5. The semiconductor device of claim 4, wherein a height of the first portion and a height of the second portion are substantially the same.

6. The semiconductor device of claim 1, wherein a maximum width of the first portion is different from a maximum width of the second portion, and wherein a height of the first portion and a height of the second portion are different.

7. The semiconductor device of claim 1, wherein a central axis of the contact pad coincides with a central axis of the channel structure, and wherein the central axis of the contact pad is staggered with a central axis of the string select channel structure.

8. The semiconductor device of claim 1, wherein the channel structure contacts the entire lower surface of the first portion, and wherein the string select channel structure contacts at least a portion of the upper surface of the second portion.

9. The semiconductor device of claim 1, wherein the first insulating layer includes silicon oxide, and the second insulating layer includes silicon nitride.

10. The semiconductor device of claim 1, further comprising:

a first string separation structure; and a second string separation structure spaced apart from the first string separation structure in a first horizontal direction that is parallel to the upper surface of the substrate, wherein the string select channel structure is interposed between the first string separation structure and the second string separation structure, and wherein, when viewed in a plan view, the contact pad is disposed in a space between the first string separation structure and the second string separation structure.

11. A semiconductor device comprising:

a plurality of gate layers and a plurality of lower insulating layers that are alternately stacked on an upper surface of a substrate in a vertical direction that is perpendicular to the upper surface of the substrate;

a channel structure passing through the plurality of gate layers and the plurality of lower insulating layers and extending in the vertical direction;

a string select gate layer disposed on the channel structure;

a string select channel structure passing through the string select gate layer and extending in the vertical direction;

a contact pad disposed in a space between the channel structure and the string select channel structure and connecting the channel structure to the string select channel structure, wherein the string select channel structure, the contact pad, and the channel structure are arranged in the vertical direction, wherein a lower surface of the contact pad contacts the channel structure, and an upper surface of the contact pad contacts the string select channel structure, wherein a first width of the lower surface of the contact pad is greater than a second width of a central portion of the contact pad, wherein a third width of the upper surface of the contact pad is greater than the second width of the central portion of the contact pad, wherein the contact pad includes:

a first portion contacting the channel structure; and a second portion contacting the string select channel structure and disposed on the first portion, wherein a first side surface of the first portion has a positive slope, and a second side surface of the second portion has a negative slope, wherein the first side surface is connected to the second side surface, wherein a width of a lower surface of the first portion corresponds to the first width and a width of an upper surface of the second portion corresponds to the third width, wherein the first width is different from the third width, and wherein a width of an upper surface of the first portion is different from a width of a lower surface of the second portion; and an upper insulating layer disposed between an uppermost gate layer of the plurality of gate layers and the string select gate layer, wherein the upper insulating layer includes:

a first insulating layer contacting a side surface of the contact pad; and a second insulating layer that is disposed above the string select gate layer, and wherein the first insulating layer and the second insulating layer include different materials.

12. A semiconductor device comprising:

a plurality of gate layers and a plurality of lower insulating layers that are alternately stacked on an upper surface of a substrate in a vertical direction that is perpendicular to the upper surface of the substrate;

a plurality of channel structures passing through the plurality of gate layers and the plurality of lower insulating layers and extending in the vertical direction;

a string select gate layer disposed on the plurality of channel structures;

a plurality of string select channel structures passing through the string select gate layer and extending in the vertical direction; and a plurality of contact pads, wherein each of the plurality of contact pads is disposed in a space between a corresponding channel structure of the plurality of channel structures and a corresponding string select channel structure of the plurality of string select channel structures and connects the corresponding channel structure to the corresponding string select channel structure, wherein each of the plurality of contact pads includes a first portion with a first side surface of a positive slope, and a second portion disposed on the first portion and having a second side surface of a negative slope, wherein the first side surface is connected to the second side surface, and wherein the plurality of contact pads include polysilicon; and an upper insulating layer disposed in a space between an uppermost gate layer of the plurality of gate layers and the string select gate layer, wherein the upper insulating layer includes:

a first insulating layer contacting a side surface of the first portion; and a second insulating layer contacting a side surface of the second portion, and wherein a thickness of the first insulating layer is different from a thickness of the second insulating layer.

13. The semiconductor device of claim 12, wherein at least one of the plurality of contact pads has a different shape from other contact pads of the plurality of contact pads.

14. The semiconductor device of claim 12, wherein the first portion contacts the corresponding channel structure, wherein the second portion contacts the corresponding string select channel structure, wherein a central axis of the first portion and a central axis of the second portion coincide with a central axis of the corresponding channel structure, and wherein the central axis of the first portion and the central axis of the second portion are staggered with a central axis of the corresponding string select channel structure.

15. An electronic system comprising:

a main substrate;

a semiconductor device on the main substrate; and a controller electrically connected to the semiconductor device on the main substrate, wherein the semiconductor device includes:

a peripheral circuit area;

a cell area including input/output connection wires electrically connected to the peripheral circuit area; and input/output pads electrically connected to the input/output connection wires extending into the cell area, wherein the cell area includes:

a plurality of gate layers and a plurality of lower insulating layers that are alternately stacked on an upper surface of a substrate in a vertical direction that is perpendicular to the upper surface of the substrate;

a channel structure passing through the plurality of gate layers and the plurality of lower insulating layers and extending in the vertical direction;

a string select gate layer disposed on the channel structure;

a string select channel structure passing through the string select gate layer and extending in the vertical direction; and a contact pad disposed in a space between the channel structure and the string select channel structure and connecting the channel structure and the string select channel structure, wherein the string select channel structure, the contact pad, and the channel structure are arranged in the vertical direction, wherein the contact pad includes a lower surface contacting the channel structure and an upper surface contacting the string select channel structure, wherein a first width of the lower surface is greater than a second width of a central portion of the contact pad, wherein a third width of the upper surface is greater than the second width of the central portion of the contact pad, wherein the contact pad includes:

a first portion contacting the channel structure; and a second portion contacting the string select channel structure and disposed on the first portion, wherein a first side surface of the first portion has a positive slope, and a second side surface of the second portion has a negative slope, wherein the first side surface is connected to the second side surface, wherein a maximum width of the first portion is different from a maximum width of the second portion, and wherein a height of the first portion and a height of the second portion are different.

16. The electronic system of claim 15, wherein the main substrate further includes wire patterns electrically connecting the semiconductor device and the controller.

* * * * *